US012627283B2

(12) United States Patent
Louvat et al.

(10) Patent No.: US 12,627,283 B2
(45) Date of Patent: May 12, 2026

(54) CIRCUIT FOR DETECTING TIMING VIOLATIONS IN A DIGITAL CIRCUIT

(71) Applicant: DOLPHIN SEMICONDUCTOR, Paris (FR)

(72) Inventors: Mathieu Louvat, Paris (FR); François Jacquet, Villard Bonnot (FR)

(73) Assignee: DOLPHIN SEMICONDUCTOR, Paris (FR)

( * ) Notice: Subject to any disclaimer, the term of this patent is extended or adjusted under 35 U.S.C. 154(b) by 0 days.

(21) Appl. No.: 18/579,159

(22) PCT Filed: Jul. 15, 2022

(86) PCT No.: PCT/EP2022/069841
§ 371 (c)(1),
(2) Date: Jan. 12, 2024

(87) PCT Pub. No.: WO2023/285647
PCT Pub. Date: Jan. 19, 2023

(65) Prior Publication Data
US 2024/0322805 A1     Sep. 26, 2024

(30) Foreign Application Priority Data

Jul. 15, 2021    (FR) ..................................... 21/07642

(51) Int. Cl.
| | |
|---|---|
| *H03K 5/00* | (2006.01) |
| *H03K 5/08* | (2006.01) |
| *H03K 5/133* | (2014.01) |
| *H03K 19/21* | (2006.01) |

(52) U.S. Cl.
CPC ............. *H03K 5/082* (2013.01); *H03K 5/133* (2013.01); *H03K 19/21* (2013.01)

(58) Field of Classification Search
CPC ............ G01R 31/31725; G01R 31/726; G01R 31/727; G01R 31/31932; G01R 31/31937; H03K 5/082; H03K 5/133; H03K 19/21; H03K 31/31725; H03K 3/012; H03K 19/00346; H03K 3/0375
See application file for complete search history.

(56) References Cited

U.S. PATENT DOCUMENTS

| | | | |
|---|---|---|---|
| 2009/0206904 A1* | 8/2009 | Shimura | ............... G06F 1/3203 |
| | | | 327/199 |
| 2010/0153896 A1* | 6/2010 | Sewall | ............... G06F 30/3312 |
| | | | 716/113 |
| 2014/0040692 A1 | 2/2014 | Shah et al. | |

(Continued)

OTHER PUBLICATIONS

International Search Report and Written Opinion for PCT/EP2022/069841 mailed Nov. 23, 2022.

*Primary Examiner* — Tuan T Lam
(74) *Attorney, Agent, or Firm* — Perilla Knox & Hildebrandt LLP

(57)     ABSTRACT

The present disclosure relates to a circuit comprising: —a first timing guard circuit (200) configured to detect when a slack time of a first data signal arriving at a first synchronous device (202) falls below a first threshold (SLG DELAY); and —a second timing guard circuit (200) configured to detect when a slack time of a second data signal arriving at a second synchronous device (202) falls below a second threshold (SLG DELAY), the first and second thresholds being different from each other.

13 Claims, 13 Drawing Sheets

(56)           References Cited

U.S. PATENT DOCUMENTS

| 2014/0132293 A1* | 5/2014 | Abadir ............. G01R 31/31725 |
| | | 324/750.3 |
| 2020/0301464 A1* | 9/2020 | Kamiya .................... G06F 1/04 |
| 2021/0081528 A1* | 3/2021 | Hershman ............... G06F 21/71 |
| 2021/0191452 A1* | 6/2021 | Herberholz ......... G06F 30/3312 |

\* cited by examiner

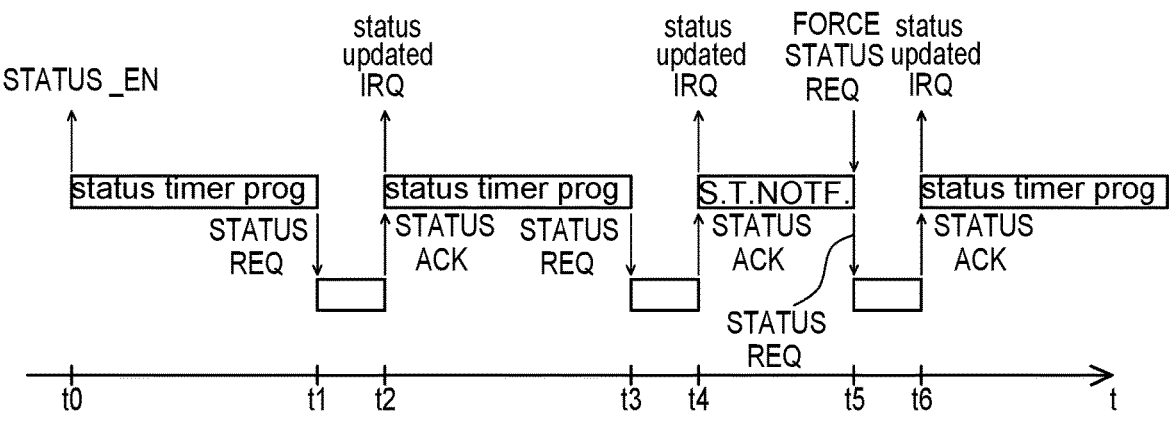
Fig. 14
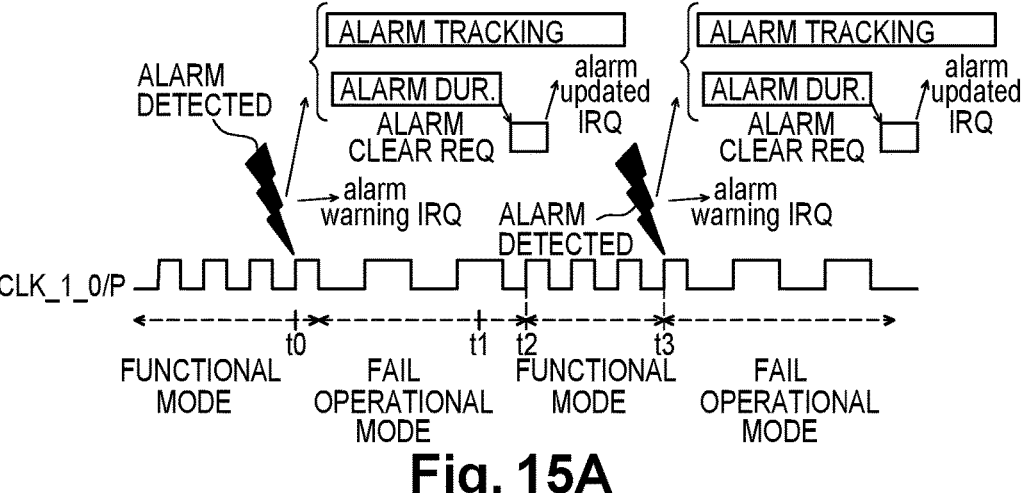
Fig. 15A
Fig. 15B

CIRCUIT FOR DETECTING TIMING VIOLATIONS IN A DIGITAL CIRCUIT

The present patent application is a 35 U.S.C. § 371 national stage patent application of Patent Cooperation Treaty application number PCT/EP2022/069841, filed Jul. 15, 2022, titled "CIRCUIT FOR DETECTING TIMING VIOLATIONS IN A DIGITAL CIRCUIT," which claims the benefit of and priority to French patent application filed on 15 Jul. 2021 and assigned application no. FR2107642, the entire contents of each of which applications is hereby incorporated herein by reference.

TECHNICAL FIELD

The present disclosure relates generally to the field of digital circuits, and in particular to the detection of potential timing violations in a digital circuit.

BACKGROUND ART

It has been proposed to improve circuit performance and/or reduce energy consumption by modifying clock frequencies and/or supply voltages supplied to areas of integrated circuits.

However, beyond a certain operating point corresponding to a clock frequency and supply voltage limit, the circuit will no longer function correctly. In particular, an integrated circuit will no longer maintain correct functionality if one or more of its synchronous devices are subjected to timing violations. Synchronous devices include flip-flops, memories and latches. Such devices are generally characterized by a setup time tS that should be respected in order to ensure stability. The setup time tS defines a time period before a significant clock edge during which the input data of the synchronous device should not change. A timing violation occurs if the setup time is not respected.

A static timing analysis of an integrated circuit design can identify one or more critical transmission paths, which are the transmission paths with the longest propagation delays between two synchronous devices in the circuit. The propagation delays on these critical transmission paths are generally used to determine the maximum permitted clock frequency of the circuit.

However, using static timing analysis to determine the maximum permitted clock frequency at various operating voltages does not allow certain variables such as PVT-RC (process, voltage, temperature, resistance-capacitance parasitics) variations to be considered. Thus, it is necessary to allow relatively large margins, leading to inefficient operation.

Monitoring circuits have been proposed that permit PVT-RC variations to be evaluated during circuit operation. Among such circuits, in-situ/in-field timing monitors have the advantage of being placed in the actual signal propagation paths in the circuit, and thus provide an accurate and localized indication of when timing violations may occur.

However, there are technical difficulties in equipping a digital circuit with in-situ timing monitors in an effective manner, and in controlling the supply voltage and/or operating frequency of the circuit in an effective manner based on the outputs of the in-situ timing monitors.

SUMMARY OF INVENTION

According to one aspect, there is provided a circuit comprising:

a first timing guard circuit configured to detect when a slack time of a first data signal arriving at a first synchronous device falls below a first threshold; and a second timing guard circuit configured to detect when a slack time of a second data signal arriving at a second synchronous device falls below a second threshold, the first and second thresholds being different from each other.

According to one embodiment:

the first data signal is generated by at least one first data path having a first worst propagation delay;

the second data signal is generated by at least one second data path having a second worst propagation delay that is greater than the first worst propagation delay; and the second threshold is lower than the first threshold.

According to one embodiment:

the first threshold is a status threshold at a first time distance from a clock edge of a clock signal of the circuit received by the first synchronous device following the arrival of the first data signal; and the second threshold is an alarm threshold at a second time distance from a clock edge of the clock signal of the circuit received by the second synchronous device following the arrival of the second data signal, the second threshold being lower than the first threshold.

According to one embodiment, the circuit comprises a plurality of said first timing guard circuits, and a timing response circuit, implemented for example by a status flag processing circuit and a control circuit, configured to:

receive status flag signals from the plurality of first timing guard circuits when the slack time of the first data signal falls below the first threshold;

compare a number of flag signals generated by the plurality of first timing guard circuits with a threshold; and apply, in response to the number of flag signals exceeding the threshold, a first supply voltage or biasing voltage adjustment and/or a first frequency reduction to the clock signal of the circuit.

According to one embodiment, the circuit comprises a plurality of said second timing guard circuits, and a protection circuit, implemented for example by an alarm flag processing circuit and a clock safety circuit, configured to:

receive alarm flag signals from the plurality of second timing guard circuits when the slack time of the second data signal falls below the second threshold; and apply, in response to the alarm signal from any of the second timing guard circuits, a second frequency reduction to the clock signal of the circuit.

According to one embodiment, the first frequency adjustment is a frequency reduction of up to 30 percent, and the second frequency adjustment is a frequency reduction of over 30 percent.

According to one embodiment, the timing response circuit is configured to implement the second frequency adjustment within 10 clock cycles, and preferably within 5 clock cycles, of the clock signal of the circuit from the assertion of the alarm flag signal.

According to one embodiment, each of the first and second timing guard circuits comprises:

a first delay buffer coupled between its clock input and a clock input node of the first synchronous device.

According to one embodiment, each of the first and second timing guard circuits comprises:

a second delay element and third delay element coupled in series between to its data input and a data input of a further synchronous device, wherein the delay introduced by the third delay element of the first timing guard circuit is different to the delay introduced by the third delay element of the second timing guard circuit.

According to a further aspect, there is provided a method of timing control in a circuit, the method comprising:

detecting, by a first timing guard circuit, when a slack time of a first data signal arriving at a first synchronous device falls below a first threshold; and detecting, by a second timing guard circuit, when a slack time of a second data signal arriving at a second synchronous device falls below a second threshold, the first and second thresholds being different from each other.

According to one embodiment:

the first data signal is generated by at least one first data path having a first worst propagation delay;

the second data signal is generated by at least one second data path having a second worst propagation delay that is greater than the first worst propagation delay; and the second threshold is lower than the first threshold.

According to one embodiment:

the first threshold is a status threshold at a first time distance from a clock edge of a clock signal of the circuit received by the first synchronous device following the arrival of the first data signal; and the second threshold is an alarm threshold at a second time distance from a clock edge of the clock signal of the circuit received by the second synchronous device following the arrival of the second data signal, the second threshold being lower than the first threshold.

According to one embodiment, the circuit comprises a plurality of said first timing guard circuits and a timing response circuit, implemented for example by a status flag processing circuit and a control circuit, the method further comprising:

receiving, by the timing response circuit, status flag signals from the plurality of first timing guard circuits when the slack time of the first data signal falls below the first threshold;

comparing, by the timing response circuit, a number of flag signals generated by the plurality of first timing guard circuits with a threshold; and applying, by the timing response circuit in response to the number of flag signals exceeding the threshold, a first supply voltage or biasing voltage adjustment and/or a first frequency reduction to the clock signal of the circuit.

According to one embodiment, the circuit comprises a plurality of said second timing guard circuits and a protection circuit, implemented for example by an alarm flag processing circuit and a clock safety circuit, the method further comprising:

receiving, by the protection circuit, alarm flag signals from the plurality of second timing guard circuits when the slack time of the second data signal falls below the second threshold; and applying, by the protection circuit in response to the alarm signal from any of the second timing guard circuits, a second frequency reduction to the clock signal of the circuit.

According to yet a further aspect, there is provided a circuit comprising:

a first timing guard circuit configured to assert a first alarm flag when it is detected that a slack time of a first data signal arriving at a first synchronous device of the first timing guard circuit falls below a first threshold;

a second timing guard circuit configured to assert a second alarm flag when it is detected that a slack time of a second data signal arriving at a first synchronous device of the second timing guard circuit falls below the first threshold, or below a second threshold different from the first threshold; and a first flag collector circuit comprising: a first asynchronous detection device configured to assert a first output signal at a first flag output of the first flag collector circuit when the first alarm flag is asserted; and a second asynchronous detection device configured to assert the first output signal at the first flag output when the second alarm flag is asserted.

According to one embodiment, the circuit comprises a protection circuit, implemented for example by an alarm flag processing circuit and a clock safety circuit, configured to:

receive the first output signal; and apply, in response to the first output signal, a first frequency reduction to a clock signal of the circuit.

According to one embodiment, the circuit further comprises a third timing guard circuit configured to assert a status flag when it is detected that a slack time of a third data signal arriving at a first synchronous device of the third timing guard circuit falls below a third threshold, wherein:

the third threshold is a status threshold at a first time distance from a clock edge of the clock signal of the circuit received by the first synchronous device of the third timing guard circuit following the arrival of the third data signal; and the first threshold is an alarm threshold at a second time distance from a clock edge of the clock signal of the circuit received by the first synchronous device of the first timing guard circuit following the arrival of the first data signal, the first threshold being lower than the third threshold.

According to one embodiment, the circuit comprises a plurality of said third timing guard circuits, and a timing response circuit, implemented for example by a status flag processing circuit and a control circuit, and coupled to the output of the first flag collector circuit, the timing response circuit being configured to:

receive status flag signals from the plurality of third timing guard circuits when the slack time of the third data signal falls below the third threshold;

compare a number of flag signals generated by the plurality of third timing guard circuits with a threshold; and apply, in response to the number of flag signals exceeding the threshold, a first supply voltage or biasing voltage adjustment and/or a frequency reduction to the clock signal of the circuit.

According to one embodiment, the circuit comprises:

a second flag collector circuit configured to assert a second output signal at a second flag output of the second flag collector circuit; and a master flag collector circuit coupled to the first and second flag outputs, and configured to generate a master flag output signal when the first or second output signal is asserted.

According to one embodiment:

the first asynchronous detection device comprises a first set-reset flip-flop, wherein the first flag is applied to a set or reset input of the first set-reset flip-flop; and the second asynchronous detection device comprises a second set-reset flip-flop, wherein the second flag is applied to a set or reset input of the second set-reset flip-flop.

According to one embodiment, outputs of the first and second asynchronous detection devices are coupled to the first flag output via an OR tree.

According to yet a further aspect, there is provided a method of detecting a slack time reduction comprising:

asserting, by a first timing guard circuit, a first alarm flag when it is detected that a slack time of a first data signal arriving at a first synchronous device of the first timing guard circuit falls below a first threshold;

asserting, by a second timing guard circuit, a second alarm flag when it is detected that a slack time of a second data signal arriving at a first synchronous device of the second timing guard circuit falls below the first threshold, or below a second threshold different from the first threshold;

asserting, by a first asynchronous detection device of a first flag collector circuit, an first output signal at a first flag output of the first flag collector circuit when the first alarm flag is asserted; and asserting, by a second asynchronous detection device of the first flag collector circuit, the first output signal at the first flag output when the second alarm flag is asserted.

According to one embodiment, the method further comprises:

asserting, by a second flag collector circuit, a second output signal at a second flag output of the second flag collector circuit; and generating, by a master flag collector circuit coupled to the first and second flag outputs, a master flag output signal when the first or second output signal is asserted.

According to one embodiment, the method comprises:

applying the first flag to a set or reset input of a first set-reset flip-flop of the first asynchronous detection device; and applying the second flag to a set or reset input of a second set-reset flip-flop of the second asynchronous detection device.

According to one embodiment, the method further comprises:

receiving, by a protection circuit of the circuit, the first output signal; and applying, by the protection circuit in response to the first output signal, a first frequency reduction to a clock signal of the circuit.

According to one embodiment, the circuit further comprises a third timing guard circuit configured to assert a status flag when it is detected that a slack time of a third data signal arriving at a first synchronous device of the third timing guard circuit falls below a third threshold, wherein:

the third threshold is a status threshold at a first time distance from a clock edge of the clock signal of the circuit received by the first synchronous device of the third timing guard circuit following the arrival of the third data signal; and the first threshold is an alarm threshold at a second time distance from a clock edge of the clock signal of the circuit received by the first synchronous device of the first timing guard circuit following the arrival of the first data signal, the first threshold being lower than the third threshold.

According to one embodiment, the circuit comprises a plurality of said third timing guard circuits, and a timing response circuit coupled to the output of the first flag collector circuit, the method further comprising:

receiving, by the timing response circuit, status flag signals from the plurality of third timing guard circuits when the slack time of the third data signal falls below the third threshold;

comparing, by the timing response circuit, a number of flag signals generated by the plurality of third timing guard circuits with a threshold; and applying, by the timing response circuit in response to the number of flag signals exceeding the threshold, a first supply voltage or biasing voltage adjustment and/or a frequency reduction to the clock signal of the circuit.

According to one embodiment, the method further comprises providing the first and second output signals of the first and second asynchronous detection devices to the first flag output via an OR tree.

BRIEF DESCRIPTION OF DRAWINGS

The foregoing features and advantages, as well as others, will be described in detail in the following description of specific embodiments given by way of illustration and not limitation with reference to the accompanying drawings, in which:

FIG. 14 is a timing diagram representing status loop management according to an example embodiment;

FIG. 15A is a timing diagram representing alarm loop management involving a fail operational mode according to an example embodiment;

FIG. 15B is a timing diagram representing alarm loop management involving a fail safe mode according to an example embodiment.

DESCRIPTION OF EMBODIMENTS

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
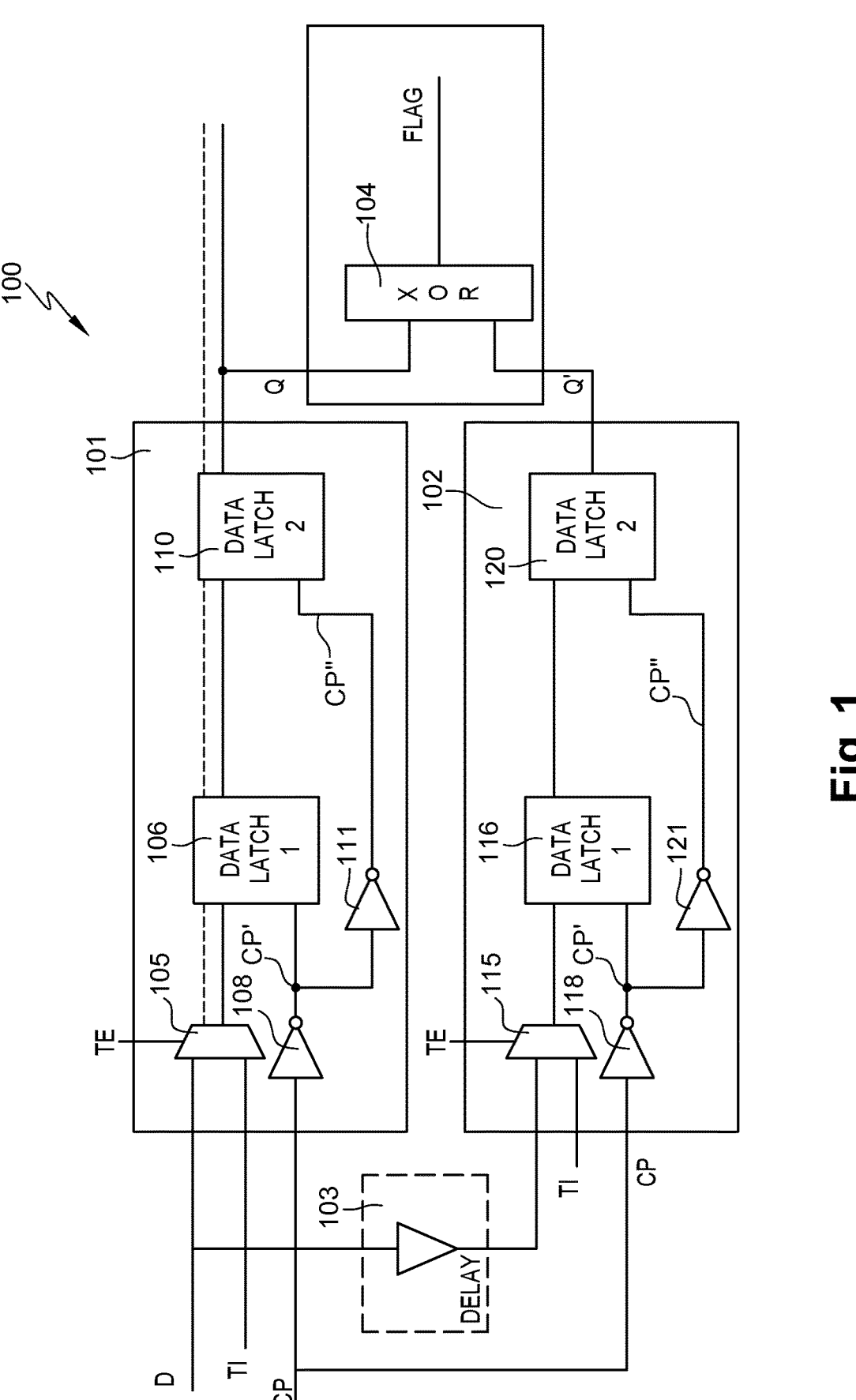
FIG. 1 schematically illustrates a synchronous device with a slack guard circuit.

FIG. 1 schematically illustrates a circuit 100 comprising a synchronous device 101, and a slack monitor comprising a further synchronous device 102, a delay element 103 and a comparison element 104, according to an implementation that has been proposed.

The synchronous device 101 for example comprises a data input receiving a data signal D, a clock input receiving a clock signal CP, a test input receiving a test input signal TI and a test enable input receiving a test enable signal TE. The synchronous device 101 generates an output signal Q based on the input signal D or TI clocked by the clock signal CP.

The synchronous device 101 for example comprises a multiplexer 105 having one of its data inputs connected to the data input of the device 101, the other of its data inputs connected to the test input of the device 101, and its control input connected to the test enable input. An output of the multiplexer 105 is connected to the data input of a latch (DATA LATCH 1) 106, which is clocked by a clock signal CP' corresponding to the clock signal CP inverted by an inverter 108. An output of the data latch 106 is connected to the data input of a further data latch (DATA LATCH 2) 110, which is clocked by a clock signal CP" corresponding to the clock signal CP' inverted by an inverter 111.

The synchronous device 102 for example comprises identical elements to those of the synchronous device 101, the elements of the device 102 corresponding to the elements 105 to 111 of the device 101 being respectively labelled 115 to 121. One of the data inputs of the multiplexer 115 of the synchronous device 102 is connected to a test data input, and the other data input is connected to the data input of the synchronous device 101 via the delay element 103 introducing a delay.

The data output signal Q of the synchronous device 101 and the data output signal Q' of the synchronous device 102, which are respectively provided by the data outputs of the latches 110 and 120, are provided to corresponding inputs of an exclusive-OR (XOR) gate implementing the comparison element 104. The XOR gate 104 generates an output signal FLAG indicating when the slack time has fallen below a given threshold.

There are several drawbacks of the slack monitor of the circuit 100 of FIG. 1. In particular, the delay 103 is fixed, and in case of any mis-match between the timing on clock paths, glitches may be present in the output flag signal FLAG.

Figure 2:
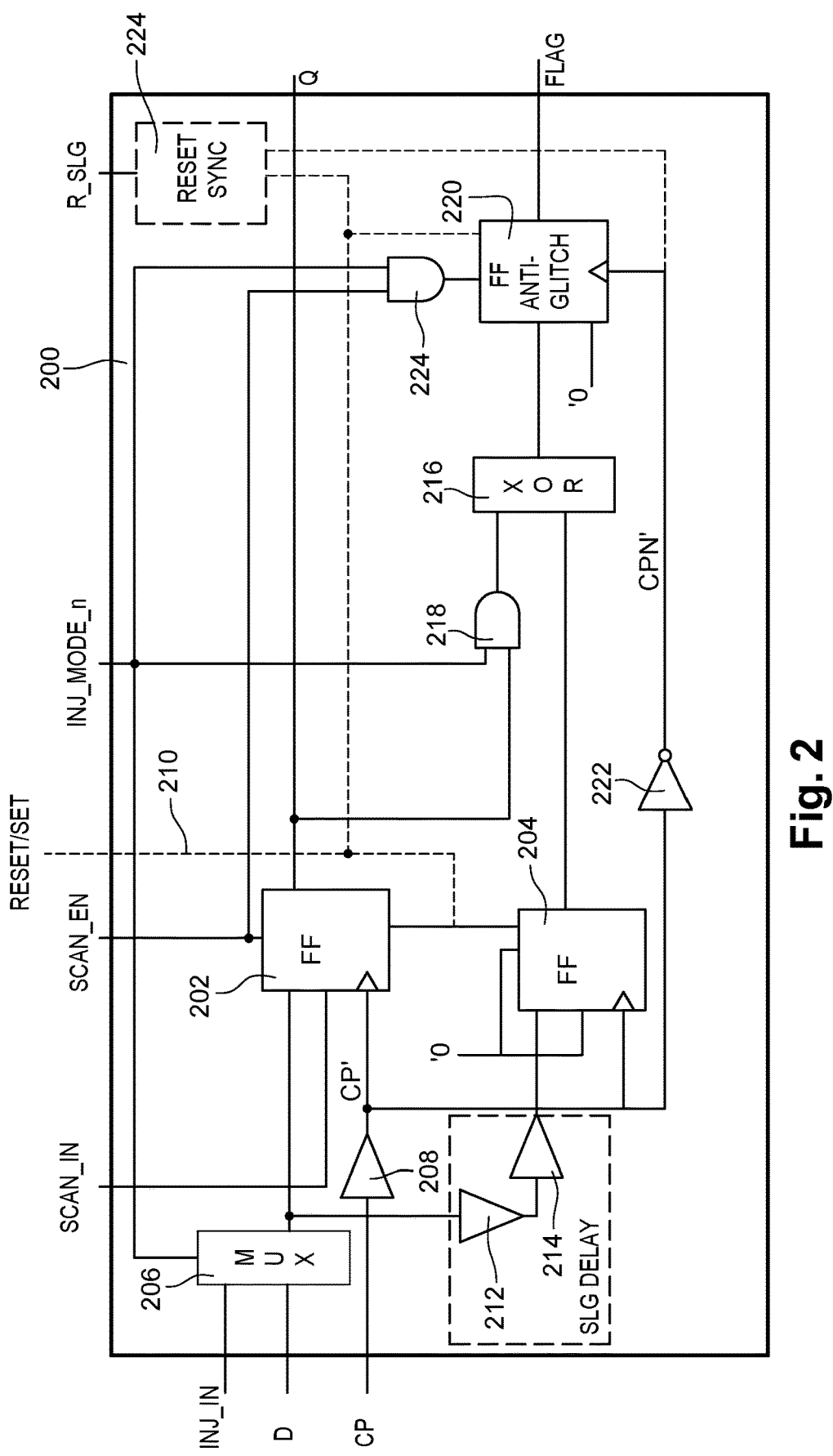
FIG. 2 schematically illustrates a synchronous cell with integrated slack guard circuit according to an example embodiment of the present disclosure.

FIG. 2 schematically illustrates a synchronous cell 200 with integrated slack guard circuit, referred to hereafter as "slack guard cell 200", according to an example embodiment of the present disclosure.

The slack guard cell 200 comprises a pair of flip-flops (FF) 202, 204, which are for example D-type flip-flops.

The flip-flop 202 for example has a data input coupled to the output of a two-input multiplexer (MUX) 206 having one of its inputs coupled to a data input of the cell receiving an input data signal D, and its other input coupled to a data injection input of the cell receiving an injection signal INJ_IN, used for example for test purposes. The flip-flip 202 also for example has a test control input receiving an input signal SCAN_IN of the cell 200, and a scan-enable input controlled by a scan enable signal SCAN_EN of the cell 200. The flip-flop 202 is clocked by a signal CP', which is for example the input clock signal CP of the cell 200 amplified by a buffer 208. In some embodiments, as represented by a dashed line 210, the flip-flop 202 has a reset or set input receiving a reset or set signal RESET/SET permitting the cell to be reinitiated. The flip-flop 202 for example provides, at its data output, an output data signal Q of the cell 200.

The integrated slack guard circuit of the cell 200 for example comprises the flip-flop 204, the multiplexer 206, delay elements 212, 214, a comparator (XOR) 216, an AND gate 218, a flip-flop (FF ANTI-GLITCH) 220, an inverter 222 and an AND gate 224.

The flip-flop 204 for example has its data input coupled to the output of the multiplexer 206 via the series connection of the delay elements 212 and 214. The delay element 212 is for example a fixed delay, whereas the delay element 214 is for example a variable delay. For example, the delay element 212 is formed by the series connection of a pair of inverters. The variable delay element 214 is for example formed by a chain of a plurality of pairs of series-connected inverters, the number of inverters being selected in order to obtain a desired target delay value. This delay value for example varies from one cell 200 to another, as will be described in more detail below. The flip-flop 204 for example has it clock input coupled to the output of the buffer 208, and its scan data and scan-enable inputs tied to a low logic state '0'. In some embodiments, the flip-flop 204 has a reset or set input receiving the reset or set signal RESET/SET on the line 210.

The data output of the flip-flop 204 is coupled to one input of the comparator 216, which is for example implemented by an XOR gate. The other input of the comparator 216 is for example coupled to the output of the AND gate 218, which for example has one of its inputs coupled to the data output of the flip-flop 202, and its other input coupled to an injection mode control input of the cell 200 receiving an injection mode control signal INJ_MODE_n, used for test purposes. The output of the comparator 216 is for example coupled to a data input of the flip-flop 220, which for example has its clock input receiving the inverse CPN' of the clock signal CP', and a scan input tied to a logic low level '0. The signal CPN' is for example generated by the invertor 222, which has its input coupled to the output of the buffer 208. The flip-flop 220 for example has a scan-enable input coupled to the output of the AND gate 224, the AND gate 224 having one input coupled to receive the signal SCA-N_EN at the scan-enable input of the cell 200, and its other input coupled to receive the signal INJ_MODE_n at the injection mode input of the cell 200. The data output of the flip-flop 220 for example provides a flag signal FLAG at the output of the cell 200.

In some embodiments, the cell 200 also comprises a reset synchronization circuit (RESET SYNC) 224 that receives a reset signal R_SLG at an input of the cell 220, as well as the clock signal CPN'. The reset synchronization circuit 224 is for example configured to generate and provide to the flip-flop 220 a resynchronized set/reset signal, based on the input reset signal R_SLG and the clock signal CPN'. If, however, the cell 200 comprises a set/reset port, the signal RESET/SET is for example provided from this port to each of the flop-flops 202, 204 and 220, and the circuit 224 can be omitted.

In operation, during a slack guard monitoring mode, the injection mode signal INJ_MODE_n is for example at a logic 1, the signals SCAN_IN and SCAN_EN are for example low, and the multiplexer 206 is controlled to supply the data signal D to the flip-flop 202 and to the delay element 212. Both of the flip-flops 202 and 204 are configured to sample the data signals at their inputs at the same time, but the data signal received by the flip-flop 204 is delayed by the additional time delay SLG DELAY of the delay elements 212 and 214 with respect to the data signal received by the flop-flop 202. Thus, if a transition in the data signal D occurs less than this time delay before a clock edge of the signal CP', the flip-flops 202 and 204 will output different logic states, resulting in a high logic state at the output of the comparator 216, and thus the assertion of the flag signal FLAG at the next falling edge of the clock signal CP', corresponding to a rising edge of the clock signal CPN'. The flag signal FLAG thus indicates when the propagation delay of the data signal has slowed by more than a given time duration with respect to the clock signal, this time duration being a function of the delay introduced by the delay elements 212 and 214.

It will be apparent to those skilled in the art that the cell 200 of FIG. 2 is merely one example, and that various changes could be introduced while maintaining the same operating principles. For example, the delay element 212 and/or the anti-glitch flip-flop 220 and/or the reset synchronization circuit 224 could be omitted in some embodiments. Furthermore, in alternative embodiments the scan-test mode and/or the injection mode is not supported, thereby simplifying the cell 200.

The cell 200 of FIG. 2 is for example inserted in place of D-type flip-flops in multiple propagation paths of a digital circuit, and the time delay introduced by the delay element 214 of each cell 200 is for example adapted to the propagation path, as will now be described in more detail with reference to FIGS. 3 and 4.

Figure 3:
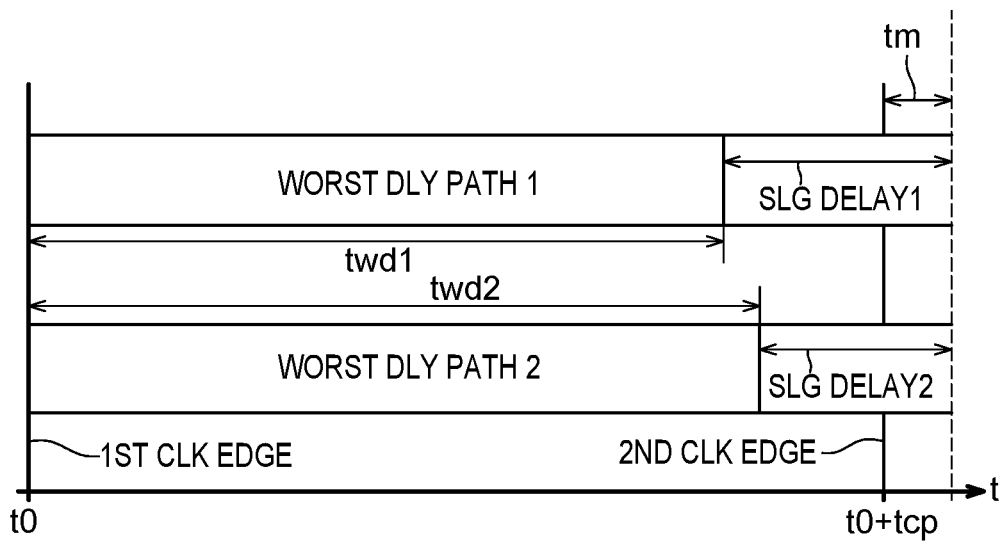
FIG. 3 is a timing diagram representing timing in two paths of a digital circuit according to an example embodiment of the present disclosure.

FIG. 3 is a timing diagram representing timing in two paths of a digital circuit clocked by the clock signal CP according to an example embodiment of the present disclosure. The time instant t0 of a first clock edge (1ST CLK EDGE) of the clock CP is shown on the left in FIG. 3, and a path 1 has a worst propagation delay (WORST DLY PATH 1) at its endpoint of a first duration twd1 with respect to the first clock edge, and a path 2 has a worst propagation delay (WORST DLY PATH 2) at its endpoint of a second duration twd2 with respect to the first clock edge, the second duration twd2 being longer than the first duration twd1. Each of the paths for example corresponds to a signal propagation path between first and second synchronous devices, the first device transmitting a data transition at the first clock edge, and the second device sampling the data at a second clock edge (2ND CLK EDGE) of the clock signal CP. The second device of each path is for example implemented by the slack guard cell 200 of FIG. 2 with a time delay adapted based on corresponding time delays twd1, twd2 of the paths. The worst path propagation delays twd1, twd2 are for example estimated based on a simulation of the worst PVT conditions in the digital circuit.

The second clock edge occurs a clock period tcp after the time t0, where tcp is greater than twd1 and twd2. The time delay SLG DELAY 1 of the synchronous cell at the endpoint of the first path is for example chosen such that the addition of the time delays twd1 and SLG DELAY 1 is equal to the clock period tcp plus a time margin tm. Similarly, the time delay SLG DELAY 2 of the synchronous cell at the endpoint of the second path is for example chosen such that the addition of the time delays twd2 and SLG DELAY 2 is equal to the clock period tcp plus the same time margin tm.

During normal operation, the actual time delays td1, td2 of the paths 1 and 2 are respectively lower than the worst delays twd1 and twd2. Thus, the sum of the time delays td1 and SLG DELAY 1 is lower than the clock period tcp, and the sum of the time delays td2 and SLG DELAY 2 is lower than the clock period tcp, meaning that the FLAG signal is not asserted. However, if the P, V, T or RC conditions degrade, and/or if the frequency of the clock signal CP is increased, the sum of the time delays td1 and SLG DELAY 1 may exceed the clock period tcp causing the FLAG signal to be asserted by the synchronous cell at the endpoint of the first path, and/or the sum of the time delays td2 and SLG DELAY 2 may exceed the clock period tcp causing the FLAG signal to be asserted by the synchronous cell at the endpoint of the second path.

In some embodiments, the time margin tm is the same for all of the synchronous device 200 of the digital circuit. In alternative embodiments, the synchronous cells 200 of the digital circuit are each configured to have one of two different time margins tm_status and tm_alarm. In other words, some of the cells 200 are configured to have the time margin tm_status, which will be referred to as a status tolerance, while others of the cells 200 are configured to have the time margin tm_alarm, which will be referred to as an alarm tolerance.

Figure 4:
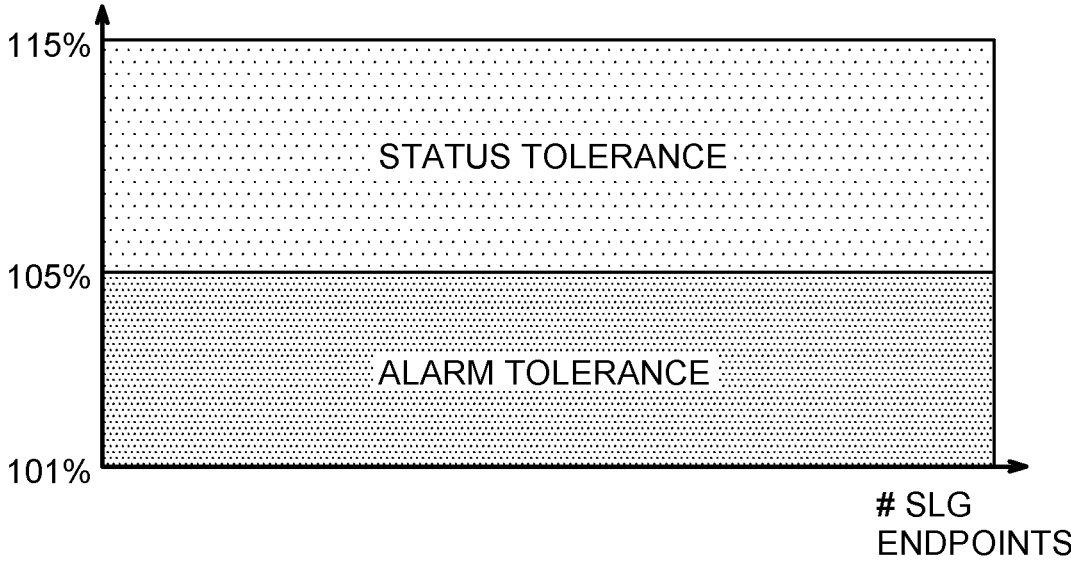
FIG. 4 is a graph illustrating an example of clock period percentage ranges for status and alarm tolerances according to an example embodiment of the present disclosure.

FIG. 4 is a graph illustrating an example of clock period percentage ranges for status and alarm tolerances for the slack guard cells (#SLG ENDPOINTS) of a digital circuit.

The status tolerance based on the time margin tm_status provides an early warning of reduced slack time. As represented in FIG. 4, in some embodiments, the status tolerance (STATUS TOLERANCE) is set such that the sum of the time delays twd and SLG DELAY is equal to between 105% and 115% of the clock period tcp. In other words, the time margin tm_status is equal to between 5 and 15% of the clock period tcp.

The alarm tolerance based on the time margin tm_alarm indicates when the slack time has reached a critical level, meaning that erroneous data transmission risks occurring if the path propagation delay degrades further. As represented in FIG. 4, in some embodiments, the alarm tolerance (ALARM TOLERANCE) is set such that the sum of the time delays twd and SLG DELAY is equal to between 101% and 105% of the clock period tcp, based on a given timing scenario with a given clock frequency, which is for example corresponds to the shortest clock period for given PVT conditions and between the different modes of the device at a given power supply voltage. In other words, the time margin tm_alarm is equal to between 1 and 5% of the clock period tcp. The time margin tm_status is for example the same for all cells applying the status tolerance, and the time margin tm_alarm is the same for all cells applying the alarm tolerance. Alternatively, in some embodiments, the loop margin tm_status and/or tm_alarm may be adjusted for different timing scenarios, such that difference sets of cells 200 are activated under different use conditions.

Figure 5:
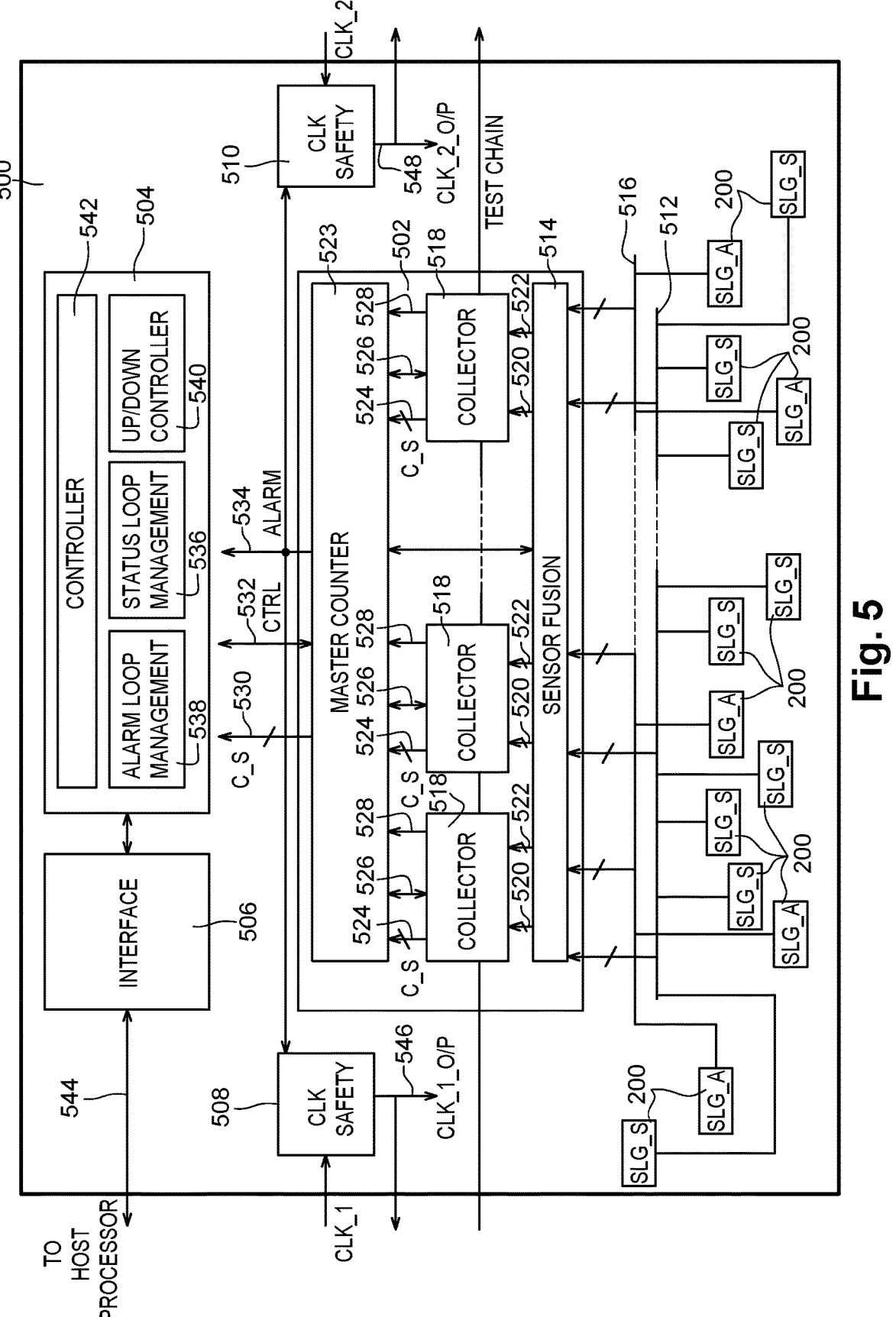
FIG. 5 schematically illustrates a timing monitoring and control system comprising synchronous cells according to an example embodiment of the present disclosure.

FIG. 5 schematically illustrates a timing monitoring and control system 500 according to an example embodiment of the present disclosure. The system 500 for example forms part of a digital device comprising one or more digital circuits including for example a host processor (not illustrated). In some embodiments, the system 500 forms part if a system-on-chip (SoC).

The timing monitoring and control system 500 for example comprises slack guard cells 200, of which some, labelled SGL_S, for example apply the status tolerance, and others, labelled SGL_A, for example apply the alarm tolerance. The system 500 also for example comprises a flag processing circuit 502, a control circuit 504 coupled to an interface (INTERFACE) 506, and clock safety circuits (CLK SAFETY) 508, 510. At least part of the flag processing circuit 502 and control circuit 504 for example form a timing response circuit. At least part of the flag processing circuit 502 and the clock safety circuit 508 or 510 for example form a protection circuit.

The slack guard cells SLG S 200 are for example coupled via a parallel bus 512 to corresponding inputs of a sensor fusion circuit (SENSOR FUSION) 514 of the flag processing circuit 502. Similarly, the slack guard cells SLG_A 200 are for example coupled via a parallel bus 516 to corresponding inputs of the sensor fusion circuit 514.

The flag processing circuit 502 for example further comprises collector circuits (COLLECTOR) 518, which are coupled to outputs of the sensor fusion circuit 514, and which are for example configured to count the number of status flags that are asserted by the slack guard cells 200, and to propagate any alarm flags that are asserted.

For example, each collector circuit 518 receives from the sensor fusion circuit 514 a set of status flags on a corresponding set of lines 520, and a set of alarm flags on a corresponding set of lines 522. In one example, each collector circuit 518 is configured to handle 60 status flags, and four alarm flags, although in alternative embodiments the collector circuits 518 could each handle a different number of status or alarm flags. While there are three collector circuits 518 in the example of FIG. 5, in alternative embodiments, there could be only one, or two or more collector circuits 518, depending on the number of slack guard cells 200.

The flag processing circuit 502 also for example comprises a master counter (MASTER COUNTER) 523, which receives from each of the collector circuits 518 a status count value c_s on lines 524, this count value for example being a 6-bit count value, control signals on one or more lines 526, and an alarm signal on a line 528.

The control circuit 504 for example receives from the master counter 523 a status flag count value C_S comprising the count values c_s from each of the collector circuits 518. For example, the status flag count value C_S is simply the concatenation of the count values c_s from each of the collector circuits 518. Alternatively, the master counter 523 comprises an adder configured to add together the count values c_s from each of the collector circuits, the count value C_S being equal to the result of this addition.

The control circuit 504 for example comprises a status loop management circuit (STATUS LOOP MANAGEMENT) 536 configured to control monitoring phases based on status flags, and to generate, during the monitoring phase, the status flag count value C_S. The control circuit 504 also for example comprises an alarm loop management circuit (ALARM LOOP MANAGEMENT) 538 configured to receive an alarm output of the master counter 523 on a line 534, and to manage circuit parameters based on the alarm flags. The control circuit 504 also for example comprises an up/down controller (UP/DOWN CONTROLLER) 540 configured to manage circuit parameters based on the status and/or alarm flags. The control circuit 504 also for example comprises a controller (CONTROLLER) 542.

The interface circuit 506 for example provides communications between the host processor and the system 500, and in particular the control circuit 504, via a line 544 (TO HOST PROCESSOR).

The clock safety circuit 508 is for example configured to receive a clock signal CLK_1 generated by a clock generator (not illustrated), and the alarm signal on the line 534, and to generate, on an output line 546, an output system clock CLK_1_O/P for clocking the cells 200 of the system 500, for example as the clock CP, and one or more further digital circuits. For example, if no alarm flag signal is asserted, the alarm output signal on the line 534 is low, and the clock safety circuit 508 is configured to output the clock signal CLK_1 as the output system clock CLK_1_O/P. Alternatively, if one or more of the slack guard cells SLG_A asserts the alarm flag, the clock safety circuit 508 is for example configured to reduce the frequency of the clock signal CLK_1, for example by dividing the clock signal CLK_1 by a factor of two or more, and to output the reduced frequency clock as the output system clock CLK_1_O/P.

In some embodiments, the system 500 is further configured to generate a further output system clock signal CLK_2_O/P for clocking another clock domain, which is separate from the clock domain clocked by the output system clock signal CLK_1_O/P. For example, some of the slack guard cells 200 form part of the clock domain of the clock signal CLK_1_O/P and are clocked by this signal, and others of the slack guard cells 200 form part of the clock domain of the clock signal CLK_2_O/P and are clocked by this signal. In a similar fashion to the clock safety circuit 508, the clock safety circuit 510 is for example configured to receive a clock signal CLK_2 generated by a clock generator (not illustrated), and the alarm signal on the line 534, and to generate on an output line 548 an output system clock CLK_2_O/P for clocking the cells 200 of the system 500 and one or more further circuits. For example, if no alarm flag signal is asserted, the alarm output signal on the line 534 is low, and the clock safety circuit 510 is configured to output the clock signal CLK_2 as the output system clock CLK_2_O/P. Alternatively, if one or more of the slack guard cells SLG_A asserts the alarm flag, the clock safety circuit 510 is for example configured to reduce the frequency of the clock signal CLK_2, for example by dividing the clock signal CLK_2 by a factor of two or more, and to output the reduced frequency clock as the output system clock CLK_2_O/P.

In some embodiments, the collector circuits 518 are linked in a daisy-chain fashion by a test chain (TEST CHAIN) permitting the circuits to be tested.

In operation, the control circuit 504 is for example configured to periodically trigger monitoring operations in order to detect the number of status flags that are asserted by the slack guard cells 200, and to detect the assertion of any alarm flag. For example, based on the number of status flags, the supply and/or biasing voltages, and/or the clock frequency applied to the circuit, including to the cells 200 and the other circuits of the device (not illustrated in FIG. 5), are for example adjusted in order for example to keep the number of flags within given lower and upper limits. For example, the clock frequency is adjusted within a range of 70 percent to 100 percent of its maximum frequency. At the same time, if any alarm flag is asserted, the clock safety circuit 508 and/or 510 for example places the circuit in a fail operational mode by reducing the clock frequency by over 30 percent, for example by dividing the clock frequency by a factor of two or more.

Figure 6:
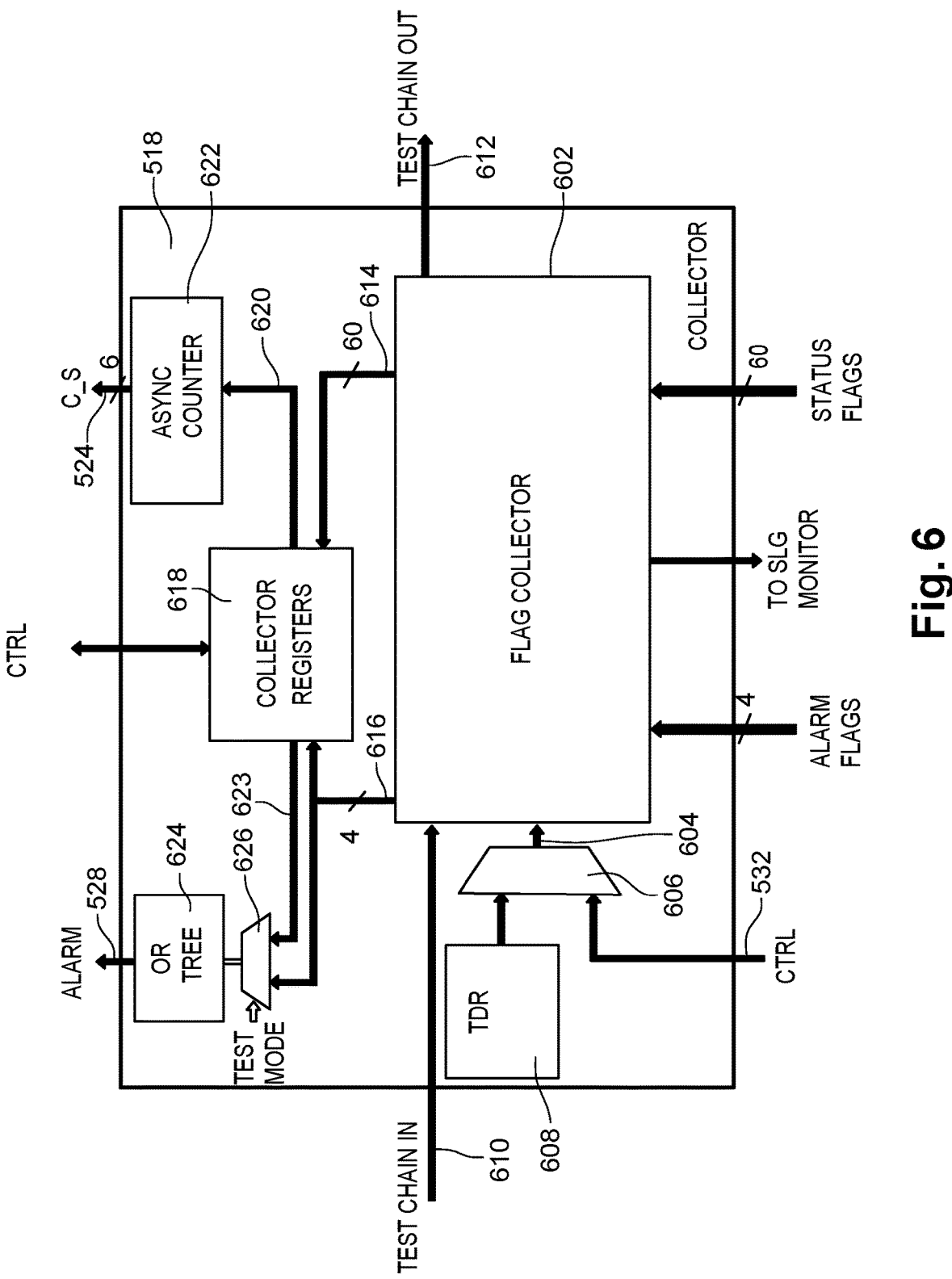
FIG. 6 schematically illustrates a collector circuit of the system of FIG. 5 in more detail according to an example embodiment of the present disclosure.

FIG. 6 schematically illustrates a collector circuit 518 of the system of FIG. 5 in more detail according to an example embodiment of the present disclosure. Each of the collector circuits 518 of FIG. 5 is for example implemented by a similar circuit.

The collector circuit 518 of FIG. 6 for example comprises a flag collector circuit (FLAG COLLECTOR) 602 configured to receive the status flags (STATUS FLAGS) from the status slack guard cells SLG S 200, there being 60 status flags received by the collector circuit 518 in the example of FIG. 5, and the alarm flags (ALARM FLAGS) from the alarm slack guard cells SLG_A 200, there being 4 alarm flags received by the collector circuit 518 in the example of FIG. 5. The flag collector circuit 602 also for example receives a control signal on an input line 604. For example, the input line 604 is coupled to the output of a multiplexer 606 configured to select, for controlling the circuit 602, either the control signals CTRL on the control input line 532 from the control circuit 504 of FIG. 5, or control signals supplied by test data registers (TDR) 608. The flag collector circuit 602 is also for example coupled to the test chain, and has one or more inputs coupled to one or more input lines 610 receiving test input signals TEST CHAIN IN, and has one or more outputs coupled to one or more output lines 612 providing test output signals TEST CHAIN OUT.

The flag collector circuit 602 is for example configured to asynchronously latch the status and alarm signals, and to provide the latched signals on parallel buses 614 and 616 respectively to a set of collector registers (COLLECTOR REGISTERS) 618. The alarm signals 616 are for example provided to an OR tree (OR TREE) 624, which for example generates the alarm signal ALARM on the output line 528 of the collector circuit 518. The set of collector registers 618 is for example configured to save the location of each flag that has been raised during a previous status count or alarm activation event. Some registers of the set 618 for example output the status flags on a parallel bus 620 to an asynchronous counter (ASYNC COUNTER) 622, which generates the output signal c_s on the output lines 524 of the collector circuit 518. In some embodiments, a bus 623 outputs certain register values from the registers 618 to provide a test point during DFT (design for test). In some embodiments, a multiplexer 626 is present between the alarm signal 616 and the OR tree 624, the multiplexer 626 also receiving the other registers of the set 618 on the bus 623 acting as the test point for the system. The multiplexer 626 is for example controlled by a test mode signal TEST MODE.

Figure 7A:
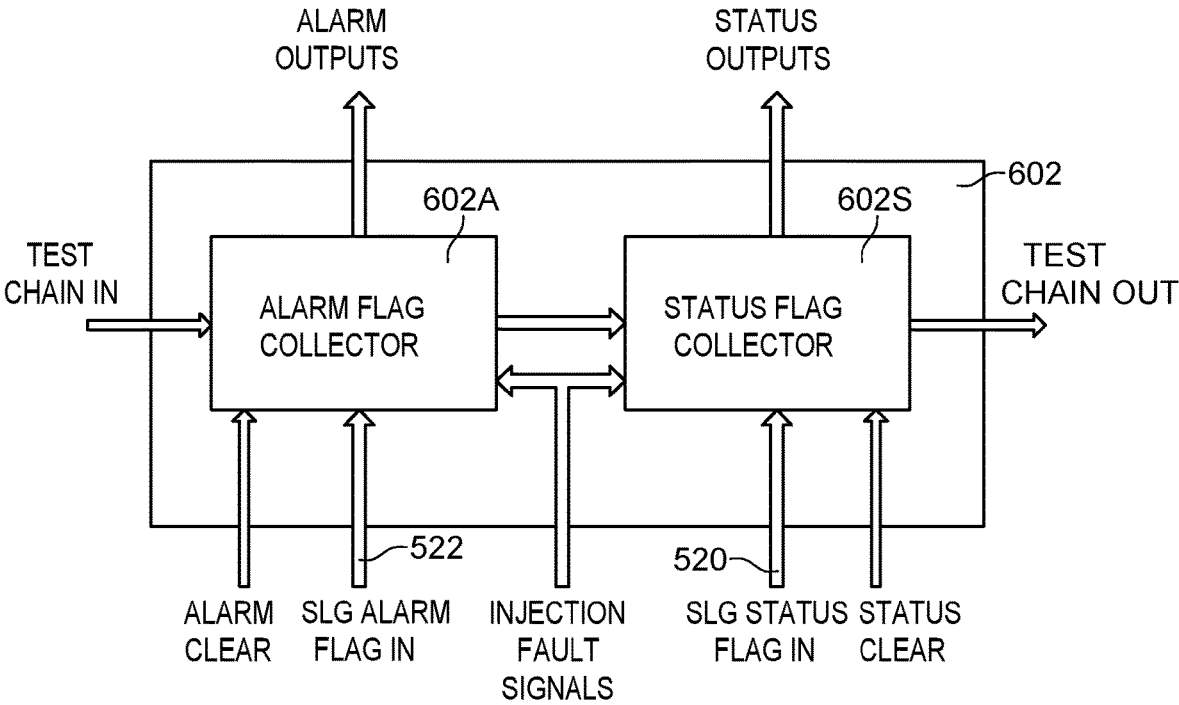
FIG. 7A schematically illustrates a flag collector of FIG. 6 in more detail according to an example embodiment of the present disclosure.

FIG. 7A schematically illustrates the flag collector circuit 602 of FIG. 6 in more detail according to an example embodiment of the present disclosure.

The flag collector circuit 602 for example comprises an alarm flag collector (ALARM FLAG COLLECTOR) 602A and a status flag collector (STATUS FLAG COLLECTOR) 602S.

The alarm flag collector 602A for example receives the slack guard alarm flags SLG ALARM FLAG IN on the input bus 522, a signal ALARM CLEAR, the test chain input signal TEST CHAIN IN, and injection fault signals (INJECTION FAULT SIGNALS). The alarm flag collector 602A for example outputs alarm signals ALARM OUTPUTS, and the test chain signal.

The status flag collector 602S for example receives the slack guard status flags SLG STATUS FLAG IN on the input bus 520, a signal STATUS CLEAR, the test chain signal from the alarm flag collector 602A, and injection fault signals (INJECTION FAULT SIGNALS). The status flag collector 602S for example outputs status signals STATUS OUTPUTS, and the test chain signal TEST CHAIN OUT.

Figure 7B:
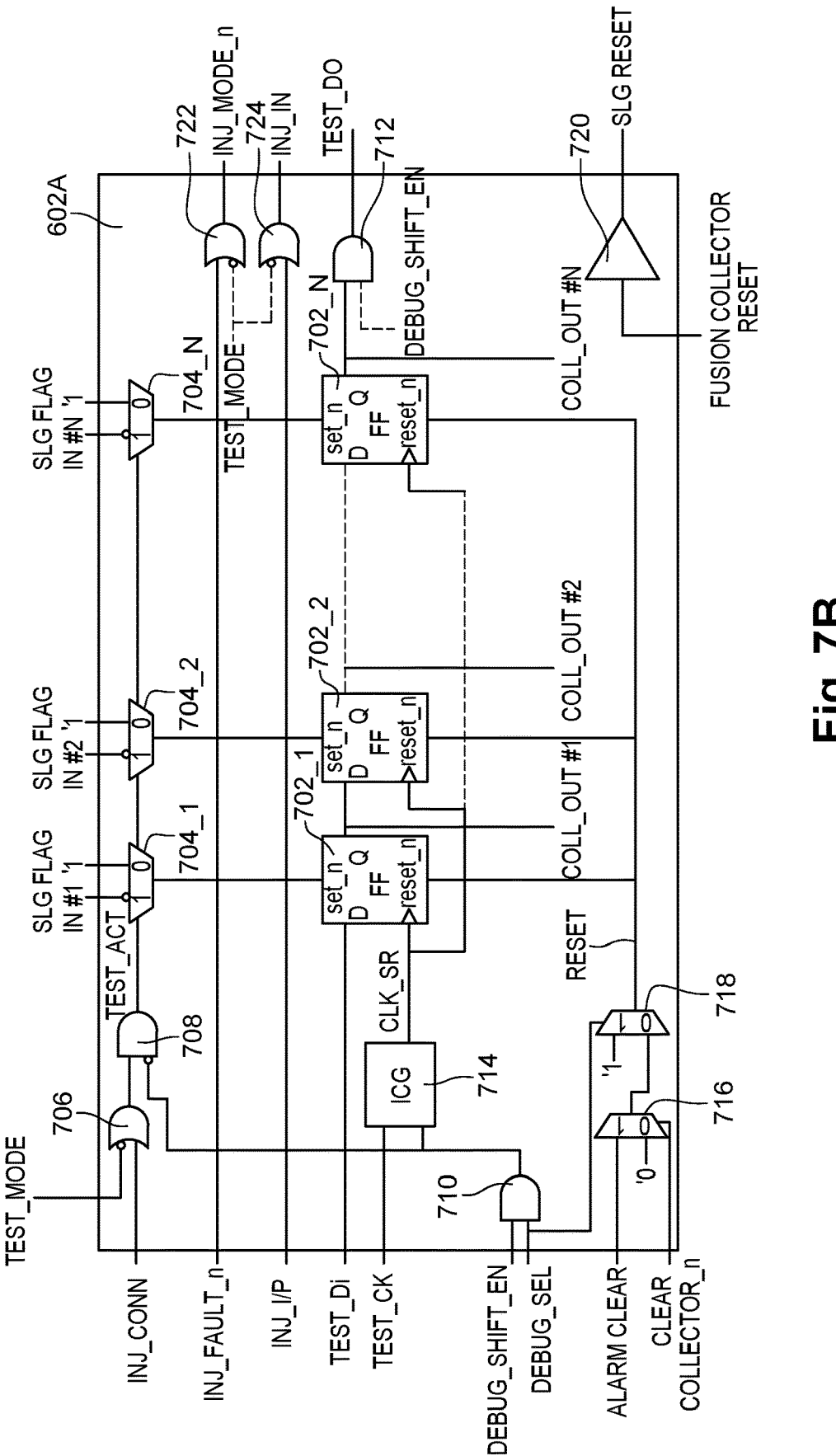
FIG. 7B schematically illustrates an alarm flag collector of FIG. 7A in more detail according to an example embodiment of the present disclosure.

FIG. 7B schematically illustrates the alarm flag collector 602A of FIG. 7A in more detail according to an example embodiment of the present disclosure. The status flag collector 602S is for example implemented by a similar circuit, except that it receives the status flags and the signal STATUS CLEAR instead of the alarm flags and the signal ALARM CLEAR.

The flag collector circuit 602 for example comprises a shift register formed of the series connection of N flip-flops labelled 702_1 to 702_N, one for example being provided for each flag signal. Thus, N is for example equal to the combined number of status and alarm flags. Each of the flip-flops 702_1 to 702_N for example receives, at its set input (set_n), a corresponding one of the flag signals SLG FLAG IN #1 to SLG FLAG IN #N of the status and alarm flags.

In some embodiments, the set inputs of the flip-flops 702_1 to 702_N are active low, the flag signals SLG FLAG IN #1 to SLG FLAG IN #N are active high, and the signals SLG FLAG IN #1 to SLG FLAG IN #N are inverted before being provided to the flip-flops 702_1 to 702_N. Furthermore, in the example of FIG. 7B, multiplexers 704_1 to 704_N are provided between the flag inputs SLG FLAG IN #1 to SLG FLAG IN #N and the flip-flops 702_1 to 702_N, each multiplexer receiving the corresponding flag signal at an inverted input, and a logic high signal '1 at its other inputs. The output of each multiplexer 704_1 to 704_N is coupled to the set input of the corresponding flip-flop 702_1 to 702_N.

The multiplexers 704_1 to 704_N are for example controlled by a test active signal TEST_ACT, which is for example generated based on input signals TEST_MODE, INJ_CONN DEBUG_SHIFT_EN and DEBUG_SEL of the flag collector circuit 602, these signals for example forming part of the input test signals TEST CHAIN IN. For example, an OR gate 706 has an inverted input coupled to the test mode signal TEST_MODE and a non-inverted input receiving the signal INJ_CONN, and has its output coupled to one input of an AND gate 708, which generates at its output the signal TEST_ACT. Another AND gate 710 has its inputs coupled to receive the signals DEBUG_SHIFT_EN and DEBUG_SEL respectively, and its output coupled to an inverted input of the AND gate 708.

The data outputs Q of the flip-flops 702_1 to 702_N for example provide the flag output signals COLL_OUT #1 to COLL_OUT #N of the flag collector circuit 602, these signals being provided for example on the parallel output bus 614 in the case of the status flags, and on the parallel output bus 616 in the cases of the alarm flags. The flip-flop 702_1 for example has its data input D coupled to a test input data signal TEST_Di, forming part of the signals TEST CHAIN IN. The data output Q of the flip-flop 702_1 is for example coupled to the data input D of the flip-flop 702_2, and so on and so forth, up to the Nth flip-flop 702_N, which has is data output Q coupled to a test data output signal TEST_Do, forming part of the signals TEST CHAIN OUT. In some embodiments, an AND gate 712 is coupled between the Q output of the flip-flop 702_N and the test output TEST_Do, the AND gate 712 for example having one input coupled to the Q output of the flip-flop 702_N, and its other input coupled to receive the signal TEST_SHIFT_EN.

The flip-flops 702_1 to 702_N are for example clocked by a clock signal CLK_SR generated by a clock generator (ICG) 714, which is for example configured to perform Internal Clock Gating (ICG). Furthermore, the flip-flops 702_1 to 702_N for example each have a reset input (reset_n), which is for example active low, coupled to receive a reset signal RESET generated for example based on the signal TEST SEL and on further signals STATUS/ALARM CLEAR and CLEAR COLLECTOR_n. For example, a multiplexer 716 has one input coupled to receive the signal STATUS/ALARM CLEAR, and a second input tied to a logic low level '0, and is controlled by the signal CLEAR COLLECTOR_n. The output of the multiplexer 716 is for example coupled to one input of a further multiplexer 718 having its second input tied to a logic high '1, and controlled by the signal TEST SEL. The output of the multiplexer 718 for example provides the signal RESET, and is coupled to the reset inputs of the flip-flips 702_1 to 702_N.

In some embodiments, the flag collector circuit 602 further comprises a buffer 720 that receives a signal FUSION COLLECTOR RESET, and generates an output signal SLG RESET, which can be used to reset the cells 200 if needed.

Furthermore, in some embodiments, the flag collector circuit 602 comprises a pair of OR gates 722, 724, the OR gate 722 receiving at one of its inputs an input signal INJ_FAULT_n, and the OR gate 724 receiving at one of its inputs an input signal INJ_I/P. Each of the OR gates 722, 724 for example comprises an inverted input coupled to the test mode signal TEST_MODE. The OR gate 722 for example generates, at an output of the circuit 602, an output signal INJ_MODE_n, and the OR gate 724 for example generates, at another output of the circuit 602, an output signal INJ_IN.

In operation, the flip-flops 702_1 to 702_N are asynchronously set by the flag signals SLG FLAG IN #1 to SLG FLAG IN #N, and their Q data outputs then remain high until they are reset during a clear operation. The contents of the flip-flops 702_1 to 702_N can be read out during a test phase using the test chain.

Figure 8:
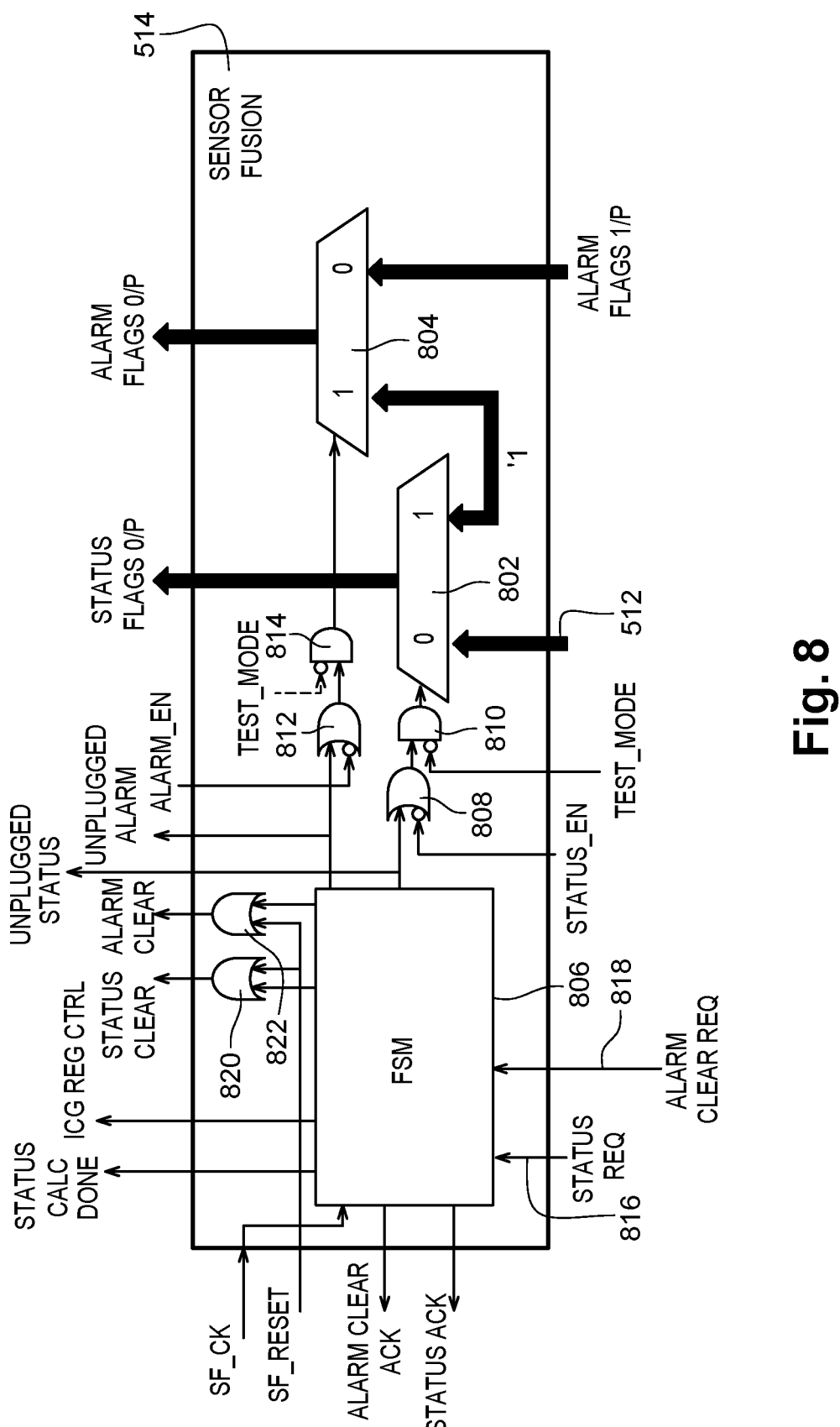
FIG. 8 schematically illustrates a sensor fusion circuit of the system of FIG. 5 in more detail according to an example embodiment of the present disclosure.

FIG. 8 schematically illustrates the sensor fusion circuit (SENSOR FUSION) 514 of the system of FIG. 5 in more detail according to an example embodiment of the present disclosure.

The sensor fusion circuit 514 for example comprises a multiplexer 802 having a first group of inputs coupled to status flag bus 512, and a second group of inputs tied to a logic high level '1, and provides at its output the status flags (STATUS FLAGS O/P), on the parallel bus 520. Similarly, the sensor fusion circuit 514 for example comprises a multiplexer 804 having a first group of inputs coupled to alarm flag bus 516, and a second group of inputs tied to the logic high level '1, and provides at its output the alarm flags (ALARM FLAGS O/P), on the parallel bus 522.

The multiplexer 802 is for example controlled based on the input signal STATUS_EN generated for example by the controller 542, based on a signal TEST_MODE, which is for example a signal originating from outside the device, for example from a test equipment, in order to set the device in a test mode, and based on a signal STATUS UNPLUGGED generated by a finite state machine (FSM) 806 of the circuit 514. For example, the signal STATUS UNPLUGGED is provided to one input of an OR gate 808, and the signal STATUS_EN is provided to an inverted input of the OR gate 808. The output of the OR gate 808 is for example coupled to an input of an AND gate 810, and the signal TEST_MODE is for example coupled to an inverted input of the AND gate 810. The output of the AND gate 810 is for example coupled to the control input of the multiplexer 802.

The multiplexer 804 is for example controlled based on the input signals ALARM_EN, TEST_MODE and the signal ALARM UNPLUGGED generated by the finite state machine (FSM) 806. For example, the signal ALARM UNPLUGGED is provided to one input of an OR gate 812, and the signal ALARM_EN is provided to an inverted input of the OR gate 812. The output of the OR gate 812 is for example coupled to an input of an AND gate 814, and the signal TEST_MODE is for example coupled to an inverted input of the AND gate 814. The output of the AND gate 814 is for example coupled to the control input of the multiplexer 804.

The FSM 806 for example receives a status request signal STATUS REQ on an input line 816, and a signal ALARM CLEAR REQ on an input line 818, and is clocked by a signal SF_CK.

The FSM 806 for example generates signals STATUS ACK, ALARM CLEAR ACK, STATUS CALC DONE and ICG REG CTRL. Furthermore, the FSM 806 is for example configured to provide an output signal to one input of an OR gate 820, which generates the signal STATUS CLEAR, and to provide an output signal to one input of an OR gate 822, which generates the signal ALARM CLEAR. A second input of each of the OR gates 820, 822 for example receives a reset signal SF_RESET.

Operation of the sensor fusion circuit 514 of FIG. 8 will now be described with reference to FIGS. 9, 10 and 11.

Figure 9:
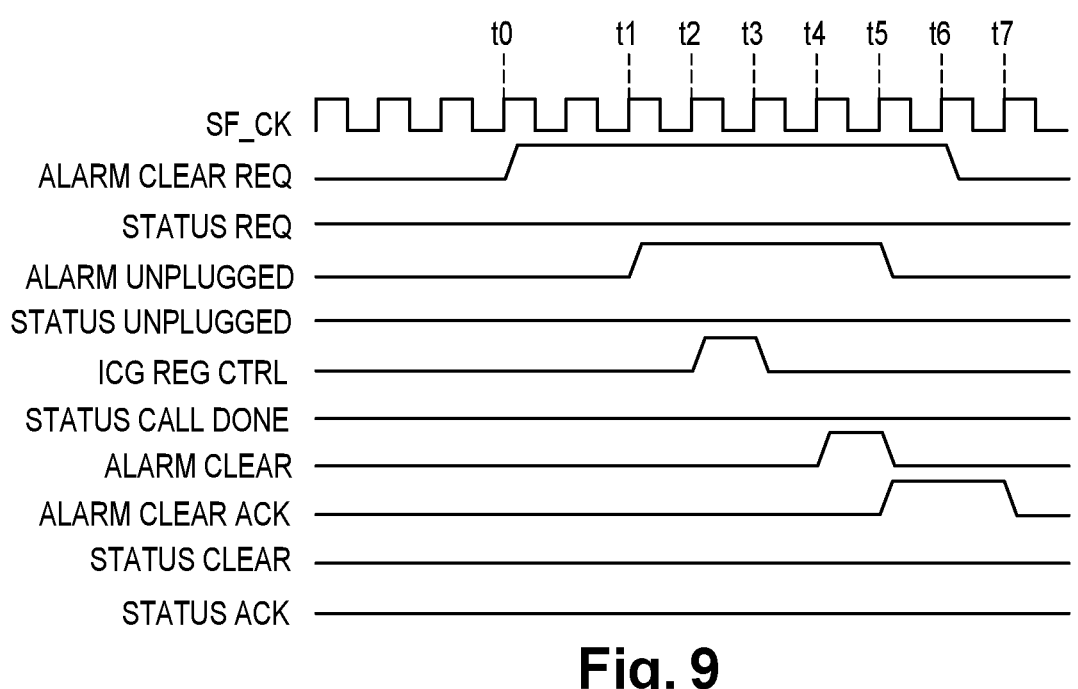
FIG. 9 is a timing diagram representing signals in the sensor fusion circuit of FIG. 8 during an alarm request according to an example embodiment of the present disclosure.

FIG. 9 is a timing diagram representing signals in the sensor fusion circuit 514 of FIG. 8 during an alarm request according to an example embodiment of the present disclosure. FIG. 9 illustrates in particular timing examples of the signals SF_CK, ALARM CLEAR REQ, STATUS REQ, ALARM UNPLUGGED, STATUS UNPLUGGED, ICG REG CTRL, STATUS CALL DONE, ALARM CLEAR, ALARM CLEAR ACK, STATUS CLEAR and STATUS ACK.

At a time t0, the signal ALARM CLEAR REQ is for example asserted by the control circuit 504 in response to a clock edge of the clock signal SF_CK. For example, this occurs in order to reset the alarm monitoring portion of the sensor fusion circuit 514 following the assertion of one or more alarm signals, and once the circuit operation has returned to normal.

At a time t1, for example in response to a clock edge two clock periods after the time t0, the signal ALARM UNPLUGGED is for example asserted by the FSM 806, in order to unplug the alarm slackguard cells from the alarm collector registers.

At a time t2, for example in response to a clock edge one clock period after t1, the signal ICG REG CTRL is for example asserted by the FSM 806. This signal is for example provided to the collector registers, and serves the purpose of saving the location of asserted alarms in the alarm collector registers. In particular, the location indicates which cell generated each alarm.

At a time t3, for example in response to a clock edge one clock period after t2, the signal ICG REG CTRL is for example deactivated.

At a time t4, for example in response to a clock edge one clock period after t3, the signal ALARM CLEAR is for example asserted by the FSM 806 and OR gate 822. This for example causes the reset signal RESET to be asserted in the flag collector circuit 602A.

At a time t5, for example in response to a clock edge one clock period after t4, the signals ALARM UNPLUGGED and ALARM CLEAR are for example deactivated, and the signal ALARM CLEAR ACK is for example asserted by the FSM 806 and provided to the control circuit 504 to indicate that the ALARM monitoring has been cleared.

At a time t6, for example in response to a clock edge one clock period after the time t5, the signal ALARM CLEAR REQ is for example deactivated by the control circuit 504.

At a time t7, for example in response to a clock edge one clock period after the time t6, the signal ALARM CLEAR ACK is for example deactivated by the FSM 806.

Figure 10:
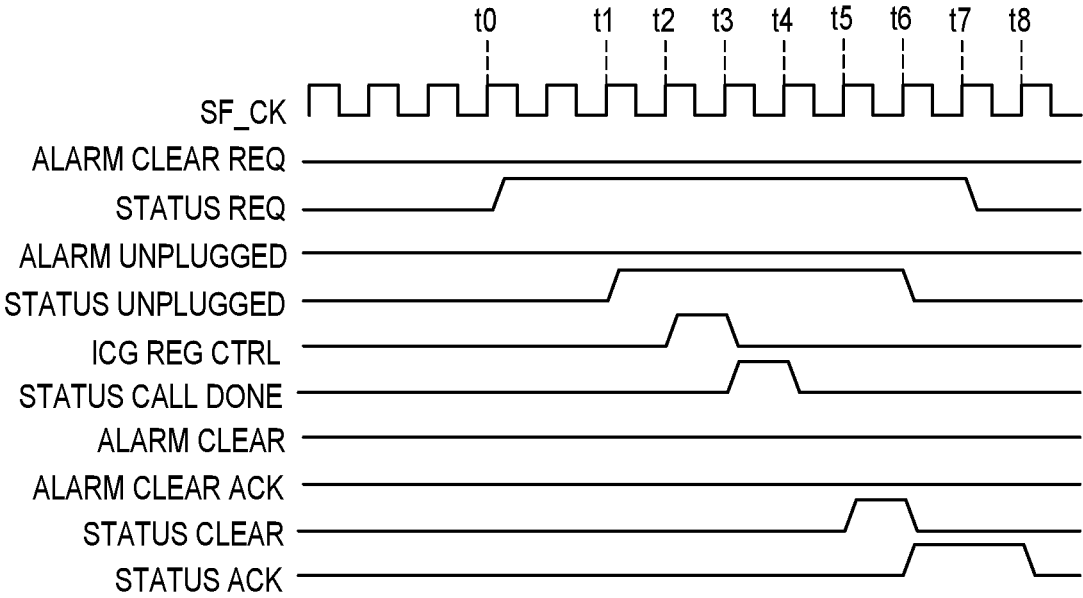
FIG. 10 is a timing diagram representing signals in the sensor fusion circuit of FIG. 8 during a status request according to an example embodiment of the present disclosure.

FIG. 10 is a timing diagram representing signals in the sensor fusion circuit of FIG. 8 during a status request according to an example embodiment of the present disclosure.

FIG. 10 illustrates in particular timing examples of the same signals as those of FIG. 9.

At a time t0, the signal STATUS REQ is for example asserted by the control circuit 504 in response to a clock edge of the clock signal SF_CK. For example, this occurs in order to request an update on the status monitoring portion of the sensor fusion circuit 514.

At a time t1, for example in response to a clock edge two clock periods after the time t0, the signal STATUS UNPLUGGED is for example asserted by the FSM 806, in order to unplug the slackguard monitor from the collector by changing the select input of the multiplexer 802 of FIG. 8.

At a time t2, for example in response to a clock edge one clock period after t1, the signal ICG REG CTRL is for example asserted by the FSM 806.

At a time t3, for example in response to a clock edge one clock period after t2, the signal ICG REG CTRL is for example deactivated, and the signal STATUS CALC DONE is for example asserted by the FSM 806. This latter signal is for example provided to the control circuit 504 and serves the purpose of acknowledging that the status counter has a new result available.

At a time t4, for example in response to a clock edge one clock period after t3, the signal STATUS CALC DONE is for example deactivated.

At a time t5, for example in response to a clock edge one clock period after t4, the signal STATUS CLEAR is for example asserted by the FSM 806. This for example causes the reset signal RESET to be asserted in the flag collector circuit 602S.

At a time t6, for example in response to a clock edge one clock period after t5, the signals STATUS CLEAR and STATUS UNPLUGGED are for example deactivated, and the signal STATUS ACK is for example asserted by the FSM 806 and provided to the control circuit 504 to indicate that the STATUS monitoring has been cleared.

At a time t7, for example in response to a clock edge one clock period after the time t5, the signal STATUS REQ is for example deactivated by the control circuit 504.

At a time t8, for example in response to a clock edge one clock period after the time t7, the signal STATUS ACK is for example deactivated by the FSM 806.

Figure 11:
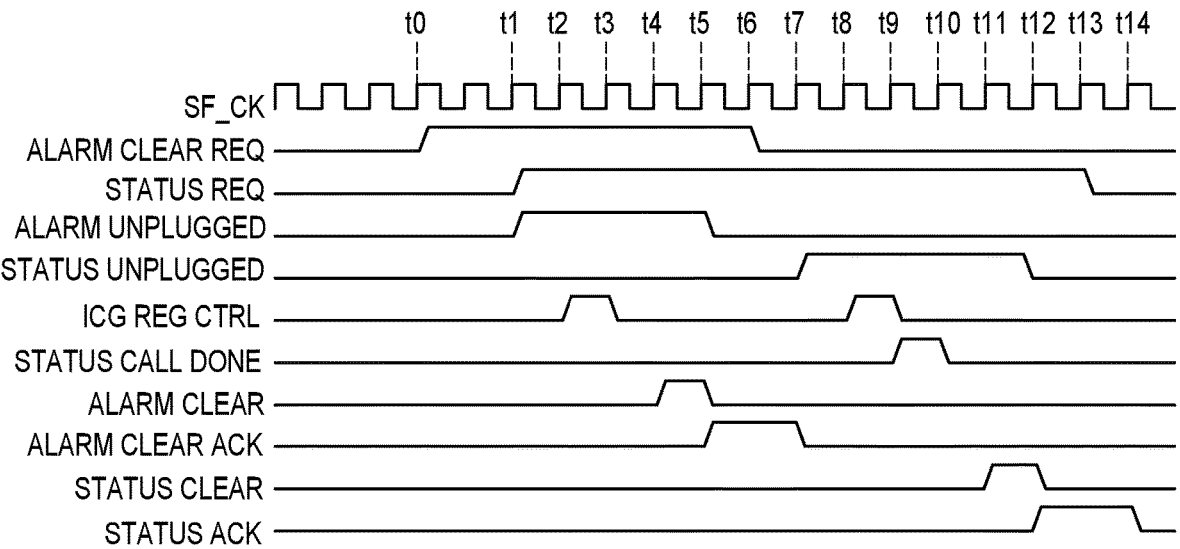
FIG. 11 is a timing diagram representing signals in the sensor fusion circuit of FIG. 8 during an alarm request with pending status request according to an example embodiment of the present disclosure.

FIG. 11 is a timing diagram representing signals in the sensor fusion circuit of FIG. 8 during an alarm request with pending status request according to an example embodiment of the present disclosure.

FIG. 11 illustrates in particular timing examples of the same signals as those of FIG. 9.

At a time t0, the signal ALARM CLEAR REQ is for example asserted by the control circuit 504 in response to a clock edge of the clock signal SF_CK. For example, this occurs in order to reset the alarm monitoring portion of the sensor fusion circuit 514 following the assertion of one or more alarm signals, and once the circuit operation has returned to normal.

At a time t1, for example in response to a clock edge two clock periods after the time t0, the signal STATUS REQ is for example asserted by the control circuit 504 in response to a clock edge of the clock signal SF_CK. For example, this occurs in order to request a status calculation of the sensor fusion circuit 514. Furthermore, at the time t1, the signal ALARM UNPLUGGED is for example asserted, and provided to the control circuit 504 to indicate that the alarm monitoring is no longer active.

At a time t2, for example in response to a clock edge one clock period after t1, the signal ICG REG CTRL is for example asserted by the FSM 806.

At a time t3, for example in response to a clock edge one clock period after t2, the signal ICG REG CTRL is for example deactivated.

At a time t4, for example in response to a clock edge one clock period after t3, the signal ALARM CLEAR is for example asserted by the FSM 806 and OR gate 822. This for example causes the reset signal RESET to be asserted in the flag collector circuit 602.

At a time t5, for example in response to a clock edge one clock period after t4, the signals ALARM UNPLUGGED and ALARM CLEAR are for example deactivated, and the signal ALARM CLEAR ACK is for example asserted by the FSM 806 and provided to the control circuit 504 to indicate that the ALARM monitoring has been cleared.

At a time t6, for example in response to a clock edge one clock period after the time t5, the signal ALARM CLEAR REQ is for example deactivated by the control circuit 504.

At a time t7, for example in response to a clock edge one clock period after the time t6, the signal ALARM CLEAR ACK is for example deactivated by the FSM 806 and the signal STATUS UNPLUGGED is for example asserted.

At a time t8, for example in response to a clock edge one clock period after the time t7, the signal ICG REG CTRL is for example asserted by the FSM 806.

At a time t9, for example in response to a clock edge one clock period after t8, the signal ICG REG CTRL is for example deactivated, and the signal STATUS CALC DONE is for example asserted by the FSM 806.

At a time t10, for example in response to a clock edge one clock period after t9, the signal STATUS CALC DONE is for example deactivated.

At a time t11, for example in response to a clock edge one clock period after t10, the signal STATUS CLEAR is for example asserted by the FSM 806. This for example causes the reset signal RESET to be asserted in the flag collector circuit 602.

At a time t12, for example in response to a clock edge one clock period after t11, the signals STATUS CLEAR and STATUS UNPLUGGED are for example deactivated, and the signal STATUS ACK is for example asserted by the FSM 806 and provided to the control circuit 504 to indicate that the STATUS monitoring has been cleared.

At a time t13, for example in response to a clock edge one clock period after the time t12, the signal STATUS REQ is for example deactivated by the control circuit 504.

At a time t14, for example in response to a clock edge one clock period after the time t13, the signal STATUS ACK is for example deactivated by the FSM 806.

Figure 12:
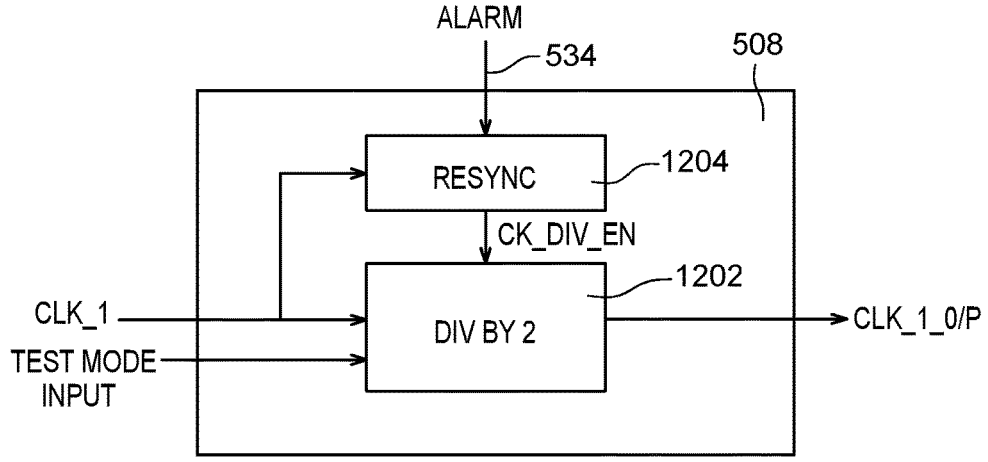
FIG. 12 schematically illustrates a clock safety circuit of the system of FIG. 5 according to an example embodiment of the present disclosure.

FIG. 12 schematically illustrates the clock safety circuit 508 of the system of FIG. 5 according to an example embodiment of the present disclosure. The circuit 510 is for example implemented by a similar circuit.

The circuit 508 for example comprises a divide by two frequency divider (DIV BY 2) 1202 configured to receive the clock signal CLK_1 and a test mode input signal TEST_MODE INPUT, provided for example by the control circuit 504. The frequency divider 1202 is enabled by an enable signal CK_DIV_EN generated by a resynchroniza- tion circuit (RESYNC) 1204, which is clocked by the clock signal CLK_1, and is configured to resynchronize the alarm signal ALARM on the line 534 with the clock signal CLK_1 in order to generate the enable signal CK_DIV_EN. The frequency divider 1202 outputs, when enabled, an output clock signal CLK_1_O/P having a reduced frequency, for example equal to half the frequency of the clock signal CLK_1. When the frequency divider 1202 is not enabled, the output clock signal CLK_1_O/P is for example the unmodi- fied clock signal CLK_1.

Figure 13:
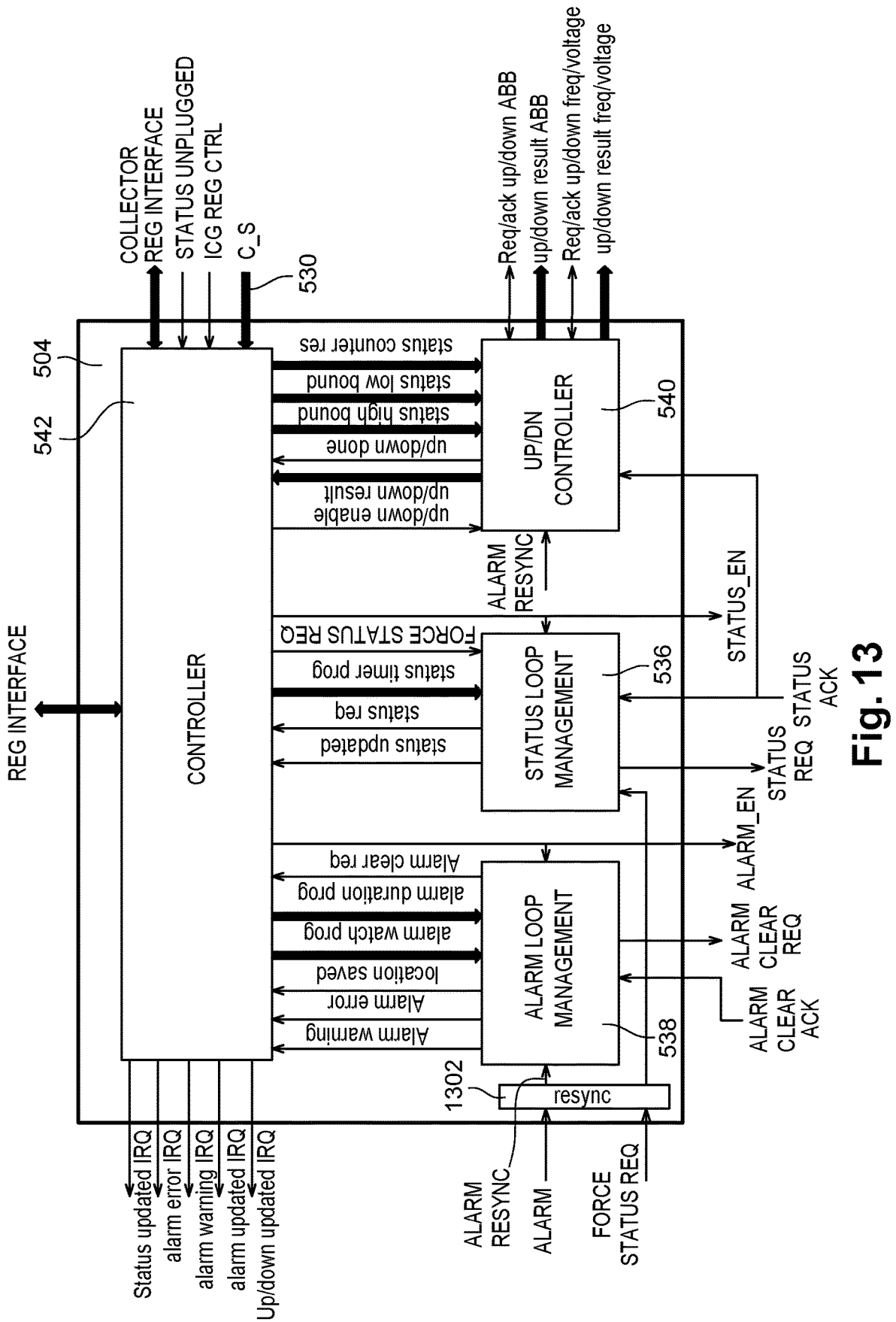
FIG. 13 schematically illustrates a control circuit of the system of FIG. 5 according to an example embodiment of the present disclosure.

FIG. 13 schematically illustrates the control circuit 504 of the system of FIG. 5 according to an example embodiment of the present disclosure.

In addition to the controller 542, the status loop manage- ment circuit (STATUS LOOP MANAGEMENT) 536, the alarm loop management circuit (ALARM LOOP MAN- AGEMENT) 538, and the up/down controller (UP/DN CONTROLLER) 540, the control circuit 504 for example comprises a resynchronization circuit (resync) 1302 config- ured to receive the alarm signal ALARM and a force status request signal FORCE STATUS REQ, which is for example a signal received via a port from the rest of a system on chip in which the circuit 500 is implemented in order to force a status request.

The resynchronized force status request signal is for example provided to the status loop management circuit 536, which also receives the status enable signal STA- TUS_EN from the controller 542, and is configured to generate the status request signal STATUS REQ, and receive the status acknowledgement signal STATUS ACK. The status loop management circuit 536 also for example receives from the controller 542 a signal "status timer prog", and a signal "force status req", and provides to the controller 542 a signal "status updated" and a signal "status req". Indeed, there are for example two ways to force a status request, one coming from an outside port and another by writing in the configuration register of the control circuit 504. The purpose of the two signals is the same, but they originate from two different sources.

The alarm loop management circuit 538 for example receives the resynchronized alarm signal ALARM from the resynchronization circuit 1302, and also the signal ALAR- M_EN from the controller 542. The circuit 538 is configured to generate the signal ALARM CLEAR REQ, and receives the acknowledgement signal ALARM CLEAR ACK. The alarm loop management circuit 538 also for example receives from the controller 542 a signal "alarm watch prog", to program the alarm tracking window, and a signal "alarm duration prog" to program the alarm duration, and for example provides to the controller 542 signals "Alarm warning", "Alarm error", "alarm updated", which indicates that the location of each alarm signal has been saved, and "Alarm clear req".

The up/down controller 540 for example receives status acknowledgement signal STATUS ACK, and generates one or more signals for adjusting supply voltages, clock frequen- cies, and/or transistor biasing voltages in the circuit. For example, it generates, and transmits to a biasing voltage control system (not illustrated), a bias voltage control signal "up/down result ABB", indicating a biasing voltage level to be applied to the circuit, and also transmits and receives on a control line, request and acknowledgement signals "Req/ ack up/down ABB" to the biasing voltage control system. Additionally or alternatively, the up/down controller 540 for example generates, and transmits to a frequency/voltage control system (not illustrated), a frequency/voltage control signal "up/down result freq/voltage", indicating a frequency and/or supply voltage level to be applied to the circuit, and also transmits and receives on a control line request and acknowledgement signals "Req/ack up/down freq/voltage" to the frequency/voltage control system.

The up/down controller 540 also for example receives from the controller 542 a signal "up/down enable", threshold signals "status high bound" and "status low bound", and a signal "status counter res", and for example provides to the controller 542 a signal "up/down result" indicating the voltage, frequency and/or biasing voltage modifications, and a control signal "up/down done" indicating when a modifi- cation to the supply voltage, circuit frequency and/or biasing voltage is available, in other words that the new up/down result has been calculated. This result for example triggers a corresponding modification to the supply voltage, circuit frequency and/or biasing voltage of the circuit.

The controller 542 for example receives the status counter signal C_S on the input line 530 from the master counter 523, and also receives the signals ICG REG CTRL and STATUS UNPLUGGED. The controller 542 also for example communicates with the collector circuits 518 via collector register interface signals COLLECTOR REG INTERFACE, such that the registers of the circuit 500 form part of the register network of the device.

The controller 542 is for example also configured to communicate with the register interface (REG INTER- FACE) 506. Furthermore, the controller 542 is for example configured to generate interrupt requests (IRQ) to the host processor, including for example one or more of: a status updated interrupt "Status updated IRQ" indicating when the status has been updated, an alarm error interrupt "alarm error IRQ", an alarm warning interrupt "alarm warning IRQ" indicating when an alarm has been activated in one or more slack guard cells, an alarm updated interrupt "alarm updated IRQ" indicating that the alarm locations have been saved, and an up/down updated interrupt "Up/down updated IRQ" indicating when the up/down controller 540 has calculated whether the circuit frequency and/or the supply or biasing voltage should be adjusted.

Operation of the status and alarm loop management modes will now be described in more detail with reference to FIGS. 14, 15A and 15B.

FIG. 14 is a timing diagram representing status loop management according to an example embodiment.

At a time t0, the signal STATUS_EN is asserted by the controller 542. For example, the control circuit 504 asserts periodically the status request signal STATUS REQ, such as every time the status timer ends. The duration of the timer is for example programmed by the "status timer prog" signals. This request is for example used to detect whether adjustments should be made to the circuit operating frequency and/or voltages.

At a time t1, the status timer ends, resulting in the assertion by the status loop management circuit 536 of the status request signal STATUS REQ.

Between the time t1 and a time t2, the status count is for example calculated and saved, as described in relation with the timing diagram of FIG. 10, and at the time t2, the status acknowledgement signal STATUS ACK is asserted by the FSM 806 of the sensor fusion circuit 514, causing for example the up/down controller 540 to propose an adjustment to the circuit operating frequency, supply voltage and/or biasing voltage based on the number of status flags. Furthermore, the status updated interrupt "status updated IRQ" is for example asserted to inform the host processor that the status data is available.

At the time t2, the status timer is restarted, and its duration is for example programmed by the signal "status timer prog" in order to trigger a new status timer monitoring phase.

At a time t3, the status timer ends, resulting in the assertion by the status loop management circuit 536 of the status request signal STATUS REQ.

Between the time t3 and a time t4, the status count is for example calculated and saved, and at the time t4, the status acknowledgement signal STATUS ACK is asserted by the FSM 806 of the sensor fusion circuit 514, causing for example the up/down controller 540 to propose an adjustment to the circuit operating frequency, supply voltage and/or biasing voltage based on the number of status flags. Furthermore, the status updated interrupt "status updated IRQ" is for example asserted to inform the host processor that the status data is available.

At the time t4, the status timer is for example restarted, and its duration is programmed with "status timer prog" in order to trigger a new status timer monitoring phase.

However, this time, before the end of the status timer, a status request is forced by the signal FORCE STATUS REQ, causing the circuit 536 to assert the status request signal STATUS REQ at a time t5. Thus, between the time t5 and a time t6, the status count is for example calculated and saved, and at the time t6, the status acknowledgement signal STATUS ACK is asserted by the FSM 806 of the sensor fusion circuit 514, causing for example the up/down controller 540 to propose an adjustment to the circuit operating frequency, supply voltage and/or biasing voltage based on the number of status flags. Furthermore, the status updated interrupt "status updated IRQ" is for example asserted to inform the host processor that the status data is available.

At the time t6, the status timer is restarted, and its duration is programmed with the signal "status timer prog" in order to trigger a new status timer monitoring phase.

FIG. 15A is a timing diagram representing alarm loop management involving a fail operational mode according to an example embodiment. FIG. 15A illustrates an example of the clock signal CLK_1_O/P, which for example initially has a frequency associated with a normal functional mode (FUNCTIONAL MODE). This may be a fixed frequency, or a frequency that varies based on the activation state of the status flags.

At a time t0, an alarm flag is for example detected (ALARM DETECTED), causing the fail operation mode (FAIL OPERATIONAL MODE) to be entered in which the frequency of the clock signal CLK_1_OP is for example divided by two, and causing an alarm tracking period (ALARM TRACKING) to be triggered, as well as an alarm duration (ALARM DUR.). Furthermore, the alarm warning interrupt "alarm warning IRQ" is for example asserted.

At a time t1, the alarm duration ends, and the alarm clear request ALARM CLEAR REQ is for example asserted in order to reinitialize the alarm flags. Thus, at a time t2, ALARM CLEAR ACK is for example asserted, and the alarm updated interrupt "alarm updated IRQ" is for example asserted. The circuit thus returns to the normal functional mode. No more alarm flags are then raised until a time t3, at which point another alarm flag is detected (ALARM DETECTED). Thus, the fail operational mode is entered again, as described previously.

FIG. 15B is a timing diagram representing alarm loop management involving a fail safe mode according to an example embodiment. Like FIG. 15A, FIG. 15B illustrates an example of the clock signal CLK_1_O/P, which for example initially has a frequency associated with a normal functional mode (FUNCTIONAL MODE). Also like in FIG. 15A, an alarm is detected (ALARM DETECTED) at a time t0, and the procedure up to the time t2 is the same as in FIG. 15A, and will not be described again in detail.

However, in the example of FIG. 15B, a new alarm is detected (ALARM DETECTED) at a time t3 before the end of the alarm tracking period ALARM TRACKING. Therefore, at the time t3, the fail safe mode (FAIL SAFE MODE) is entered. In the fail safe mode, another level of IRQ is raised, which is an interrupt "alarm error IRQ", which is raised instead of "alarm warning IRQ". In this mode, the frequency of the clock signal CLK_1_OP is for example again divided by two, and the other operations taken in case of the fail operational mode are for example implemented.

Figure 16:
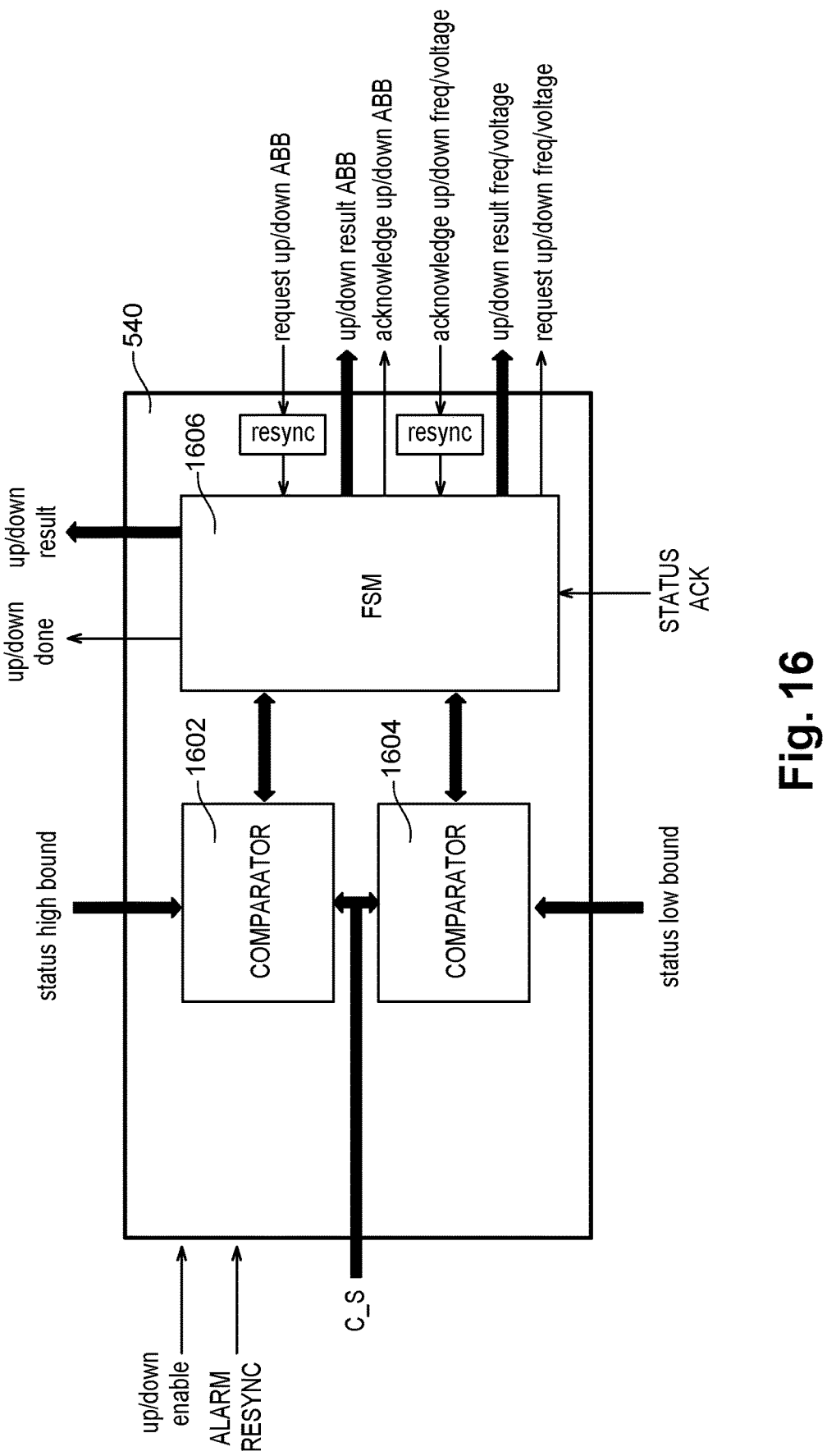
FIG. 16 schematically illustrates an up/down management circuit of the control circuit of FIG. 13 in more detail according to an example embodiment of the present disclosure.

FIG. 16 schematically illustrates the up/down management circuit 540 of the control circuit 504 of FIG. 13 in more detail according to an example embodiment of the present disclosure.

The up/down management circuit 540 for example comprises comparators 1602, 1604 and a finite state machine (FSM) 1606. A comparison operation is for example triggered by the assertion by the controller 542 of the signal STATUS ACK. However, if the alarm is asserted, no up/down calculation is made.

The comparator 1602 is for example configured to compare the status flag count value C_S with a high threshold defined by the signal "status high bound". If the number of status flags as indicated by the status flag count value C_S exceeds this threshold, the FSM 1606 is for example configured to warn the system that an operating frequency reduction, and/or an increase in the supply voltage and/or biasing voltage of the circuit, is requested, using the signals described in relation with FIG. 13.

The comparator 1604 is for example configured to compare the status flag count value C_S with a low threshold defined by the signal "status low bound". If the number of status flags as indicated by the status flag count value C_S is less than this threshold, the FSM 1606 is for example configured to warn the system that an increase in the operating frequency, and/or a reduction in the supply voltage and/or biasing voltage of the circuit, is requested using the signals described in relation with FIG. 13

The FSM 1606 is for example configured to inform the control circuit 504 when the comparison has been made, by asserting the signal "up/down done", and indicating the result of the comparison using the signal "up/down result".

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

The invention claimed is:

1. A circuit comprising:
a plurality of first timing guard circuits each configured to detect when a slack time of a first data signal arriving at a first synchronous device falls below a first threshold;
a second timing guard circuit configured to detect when a slack time of a second data signal arriving at a second synchronous device falls below a second threshold, the first and second thresholds being different from each other; and
a timing response circuit configured to:
receive status flag signals from the plurality of first timing guard circuits when the slack time of the first data signal falls below the first threshold;
compare a number of flags signals generated by the plurality of first timing guard circuits with a threshold; and
apply, in response to the number of flag signal exceeding the threshold, a first supply voltage or biasing voltage adjustment and/or a first frequency reduction to a clock signal of the circuit.

2. The circuit of claim 1, wherein:
the first data signal is generated by at least one first data path having a first worst propagation delay;
the second data signal is generated by at least one second data path having a second worst propagation delay that is greater than the first worst propagation delay; and
the second threshold is lower than the first threshold.

3. The circuit of claim 1, wherein:
the first threshold is a status threshold at a first time distance from a clock edge of the clock signal of the circuit received by the first synchronous device following the arrival of the first data signal; and
the second threshold is an alarm threshold at a second time distance from a clock edge of the clock signal of the circuit received by the second synchronous device following the arrival of the second data signal, the second threshold being lower than the first threshold.

4. The circuit of claim 1, comprising a plurality of said second timing guard circuits, and a protection circuit configured to:
receive alarm flag signals from the plurality of second timing guard circuits when the slack time of the second data signal falls below the second threshold; and
apply, in response to the alarm signal from any of the second timing guard circuits, a second frequency reduction to the clock signal of the circuit.

5. The circuit of claim 4, wherein the first frequency reduction is of up to 30 percent, and the second frequency reduction is of over 30 percent.

6. The circuit of claim 5, wherein the timing response circuit is configured to implement the second frequency reduction within 10 clock cycles, and preferably within 5 clock cycles, of the clock signal of the circuit from the assertion of the alarm flag signal.

7. The circuit of claim 1, wherein each of the first and second timing guard circuits comprises:
a first delay buffer coupled between its clock input and a clock input node of the first synchronous device.

8. The circuit of claim 1, wherein each of the first and second timing guard circuits comprises:
a second delay element and third delay element coupled in series between to its data input and a data input of a further synchronous device, wherein the delay introduced by the third delay element of each of the first timing guard circuit is different to the delay introduced by the third delay element of the second timing guard circuit.

9. A method of timing control in a circuit, the method comprising:
detecting, by each of a plurality of first timing guard circuits, when a slack time of a first data signal arriving at a first synchronous device falls below a first threshold;
detecting, by a second timing guard circuit, when a slack time of a second data signal arriving at a second synchronous device falls below a second threshold, the first and second thresholds being different from each other;
receiving, by the timing response circuit, status flag signals from the plurality of first timing guard circuits when the slack time of the first data signal falls below the first threshold;
comparing, by the timing response circuit, a number of flag signals generated by the plurality of first timing guard circuits with a threshold; and
applying, by the timing response circuit in response to the number of flag signals exceeding the threshold, a first supply voltage or biasing voltage adjustment and/or a first frequency reduction to a clock signal of the circuit.

10. The method of claim 9, wherein:
the first data signal is generated by at least one first data path having a first worst propagation delay;
the second data signal is generated by at least one second data path having a second worst propagation delay that is greater than the first worst propagation delay; and
the second threshold is lower than the first threshold.

11. The method of claim 9, wherein:
the first threshold is a status threshold at a first time distance from a clock edge of the clock signal of the circuit received by the first synchronous device following the arrival of the first data signal; and
the second threshold is an alarm threshold at a second time distance from a clock edge of the clock signal of the circuit received by the second synchronous device following the arrival of the second data signal, the second threshold being lower than the first threshold.

12. The method of claim 9, wherein the circuit comprises a plurality of said second timing guard circuits and a protection circuit, the method further comprising:
receiving, by the protection circuit, alarm flag signals from the plurality of second timing guard circuits when the slack time of the second data signal falls below the second threshold; and
applying, by the protection circuit in response to the alarm signal from any of the second timing guard circuits, a second frequency reduction to the clock signal of the circuit.

13. A circuit comprising:
a first timing guard circuit configured to detect when a slack time of a first data signal arriving at a first synchronous device falls below a first threshold;

a plurality of second timing guard circuits each configured to detect when a slack time of a second data signal arriving at a second synchronous device falls below a second threshold, the first and second thresholds being different from each other; and a protection circuit configured to:

receive alarm flag signals from the plurality of second timing guard circuits when the slack time of the second data signal falls below the second threshold; and apply, in response to the alarm signal from any of the second timing guard circuits, a second frequency reduction to a clock signal of the circuit.

\* \* \* \* \*